United States Patent [19]

Luke et al.

[11] 4,107,650

[45] Aug. 15, 1978

[54] ERROR CORRECTION ENCODER AND DECODER

[75] Inventors: Perry J. Luke, Silver Spring; James L. Machamer, Baltimore; William A. Becraft, Silver Spring, all of Md.

[73] Assignee: The Johns Hopkins University, Baltimore, Md.

[21] Appl. No.: 714,330

[22] Filed: Aug. 13, 1976

[51] Int. Cl.² .............................................. G06F 7/12
[52] U.S. Cl. .......................................... 340/146.1 AL
[58] Field of Search .................. 340/146.1, 146.1 AL, 340/146.1 AV, 146.1 F

[56] References Cited

U.S. PATENT DOCUMENTS

| Re. 28,923 | 8/1976 | Patel | 340/146.1 AL |
|---|---|---|---|
| 3,745,528 | 7/1973 | Patel | 340/146.1 AL |
| 3,851,306 | 11/1974 | Patel | 340/146.1 AL |
| 3,868,632 | 2/1975 | Hong et al. | 340/146.1 AL |

*Primary Examiner*—David H. Malzahn
*Attorney, Agent, or Firm*—Robert E. Archibald; Marc A. Block

[57] ABSTRACT

The present invention relates to an apparatus and method for detecting and correcting burst errors of indeterminate length occurring in data entered along a magnetic tape or other storage medium. An encoder and decoder arrangement is provided wherein parity or check bytes are encoded and decoded across data blocks which are measured along and across the tracks of the storage medium and wherein the parity or check bytes are read onto separate tracks of the storage medium. The present invention provides for the continuous encoding and decoding of data because the parity bytes and data bytes are conveyed to and from the storage medium along separate tracks.

33 Claims, 18 Drawing Figures

TABLE OF NON-ZERO ELEMENTS OF GF (16)

| | |
|---|---|
| $\alpha^0$ | 0 0 0 1 |
| $\alpha$ | 0 0 1 0 |
| $\alpha^2$ | 0 1 0 0 |
| $\alpha^3$ | 1 0 0 0 |
| $\alpha^4 = \alpha + 1$ | 0 0 1 1 |
| $\alpha^5 = \alpha^2 + \alpha$ | 0 1 1 0 |
| $\alpha^6 = \alpha^3 + \alpha^2$ | 1 1 0 0 |
| $\alpha^7 = \alpha^3 + \alpha + 1$ | 1 0 1 1 |
| $\alpha^8 = \alpha^2 + 1$ | 0 1 0 1 |
| $\alpha^9 = \alpha^3 + \alpha$ | 1 0 1 0 |
| $\alpha^{10} = \alpha^2 + \alpha + 1$ | 0 1 1 1 |
| $\alpha^{11} = \alpha^3 + \alpha^2 + \alpha$ | 1 1 1 0 |
| $\alpha^{12} = \alpha^3 + \alpha^2 + \alpha + 1$ | 1 1 1 1 |
| $\alpha^{13} = \alpha^3 + \alpha^2 + 1$ | 1 1 0 1 |
| $\alpha^{14} = \alpha^3 + 1$ | 1 0 0 1 |
| $\alpha^{15} = 1$ | 0 0 0 1 |

EXAMPLE: $\alpha^5 = \alpha^4 \cdot \alpha = (\alpha + 1)\alpha = \alpha^2 + \alpha$

FIG. 8

CONTENTS OF ROM 406

| $S_1$\$S_0$ | 0 | 1 | 2 | 3 | 4 | 5 | 6 | 7 | 10 | 11 | 12 | 13 | 14 | 15 | 16 | 17 |
|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 |
| 1 | 0 | 1 | 17 | 14 | 17 | 10 | 13 | 6 | 17 | 2 | 7 | 11 | 12 | 3 | 5 | 4 |
| 2 | 0 | 2 | 1 | 17 | 17 | 11 | 14 | 7 | 17 | 3 | 10 | 12 | 13 | 4 | 6 | 5 |
| 3 | 0 | 5 | 4 | 1 | 3 | 14 | 17 | 12 | 2 | 6 | 13 | 17 | 17 | 7 | 11 | 10 |
| 4 | 0 | 3 | 2 | 17 | 1 | 12 | 17 | 10 | 17 | 4 | 11 | 13 | 14 | 5 | 7 | 6 |
| 5 | 0 | 11 | 10 | 5 | 7 | 1 | 4 | 17 | 6 | 12 | 17 | 2 | 3 | 13 | 17 | 14 |
| 6 | 0 | 6 | 5 | 2 | 4 | 17 | 1 | 13 | 3 | 7 | 14 | 17 | 17 | 10 | 12 | 11 |
| 7 | 0 | 13 | 12 | 7 | 11 | 3 | 6 | 1 | 10 | 14 | 2 | 4 | 5 | 17 | 17 | 17 |
| 10 | 0 | 4 | 3 | 17 | 2 | 13 | 17 | 11 | 1 | 5 | 12 | 14 | 17 | 6 | 10 | 7 |
| 11 | 0 | 17 | 17 | 13 | 17 | 7 | 12 | 5 | 14 | 1 | 6 | 10 | 11 | 2 | 4 | 3 |
| 12 | 0 | 12 | 11 | 6 | 10 | 2 | 5 | 17 | 7 | 13 | 1 | 3 | 4 | 14 | 17 | 17 |
| 13 | 0 | 10 | 7 | 4 | 6 | 17 | 3 | 17 | 5 | 11 | 17 | 1 | 2 | 12 | 14 | 13 |
| 14 | 0 | 7 | 6 | 3 | 5 | 17 | 2 | 14 | 4 | 10 | 17 | 17 | 1 | 11 | 13 | 12 |
| 15 | 0 | 17 | 17 | 12 | 14 | 6 | 11 | 4 | 13 | 17 | 5 | 7 | 10 | 1 | 3 | 2 |
| 16 | 0 | 14 | 13 | 10 | 12 | 4 | 7 | 2 | 11 | 17 | 3 | 5 | 6 | 17 | 1 | 17 |
| 17 | 0 | 17 | 14 | 11 | 13 | 5 | 10 | 3 | 12 | 17 | 4 | 6 | 7 | 17 | 2 | 1 |

CONTENTS OF ROM 522

| g\s1 | 0 | 1 | 2 | 3 | 4 | 5 | 6 | 7 | 10 | 11 | 12 | 13 | 14 | 15 | 16 | 17 |
|---|---|---|---|---|---|---|---|---|---|---|---|---|---|---|---|---|
| 0 | 0 | 1 | 2 | 3 | 4 | 5 | 6 | 7 | 10 | 11 | 12 | 13 | 14 | 15 | 16 | 17 |
| 1 | 0 | 1 | 2 | 3 | 4 | 5 | 6 | 7 | 10 | 11 | 12 | 13 | 14 | 15 | 16 | 17 |
| 2 | 0 | 11 | 1 | 10 | 2 | 13 | 3 | 12 | 4 | 15 | 5 | 14 | 6 | 17 | 7 | 16 |
| 3 | 0 | 15 | 11 | 4 | 1 | 14 | 10 | 5 | 2 | 17 | 13 | 6 | 3 | 16 | 12 | 7 |
| 4 | 0 | 17 | 15 | 2 | 11 | 6 | 4 | 13 | 1 | 16 | 14 | 3 | 10 | 7 | 5 | 12 |
| 5 | 0 | 16 | 17 | 1 | 15 | 3 | 2 | 14 | 11 | 7 | 6 | 10 | 4 | 12 | 13 | 5 |
| 6 | 0 | 7 | 16 | 11 | 17 | 10 | 1 | 6 | 15 | 12 | 3 | 4 | 2 | 5 | 14 | 13 |
| 7 | 0 | 12 | 7 | 15 | 16 | 4 | 11 | 3 | 17 | 5 | 10 | 2 | 1 | 13 | 6 | 14 |
| 10 | 0 | 5 | 12 | 17 | 7 | 2 | 15 | 10 | 16 | 13 | 4 | 1 | 11 | 14 | 3 | 6 |
| 11 | 0 | 13 | 5 | 16 | 12 | 1 | 17 | 4 | 7 | 14 | 2 | 11 | 15 | 6 | 10 | 3 |
| 12 | 0 | 14 | 13 | 7 | 5 | 11 | 16 | 2 | 12 | 6 | 1 | 15 | 17 | 3 | 4 | 10 |
| 13 | 0 | 6 | 14 | 12 | 13 | 15 | 7 | 1 | 5 | 3 | 11 | 17 | 16 | 10 | 2 | 4 |
| 14 | 0 | 3 | 6 | 5 | 14 | 17 | 12 | 11 | 13 | 10 | 15 | 16 | 7 | 4 | 1 | 2 |
| 15 | 0 | 0 | 0 | 0 | 0 | 0 | 0 | 0 | 0 | 0 | 0 | 0 | 0 | 0 | 0 | 0 |
| 16 | 0 | 0 | 0 | 0 | 0 | 0 | 0 | 0 | 0 | 0 | 0 | 0 | 0 | 0 | 0 | 0 |
| 17 | 0 | 0 | 0 | 0 | 0 | 0 | 0 | 0 | 0 | 0 | 0 | 0 | 0 | 0 | 0 | 0 |

FIG. 14

CONTENTS OF ROM 528

| r-g\s2 | 0 | 1 | 2 | 3 | 4 | 5 | 6 | 7 | 10 | 11 | 12 | 13 | 14 | 15 | 16 | 17 |
|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 |
| 1 | 0 | 17 | 15 | 2 | 11 | 6 | 4 | 13 | 1 | 16 | 14 | 3 | 10 | 7 | 5 | 12 |
| 2 | 0 | 12 | 7 | 15 | 16 | 4 | 11 | 3 | 17 | 5 | 10 | 2 | 1 | 13 | 6 | 14 |
| 3 | 0 | 3 | 6 | 5 | 14 | 17 | 12 | 11 | 13 | 10 | 15 | 16 | 7 | 4 | 1 | 2 |
| 4 | 0 | 10 | 3 | 13 | 6 | 16 | 5 | 15 | 14 | 4 | 17 | 7 | 12 | 2 | 11 | 1 |
| 5 | 0 | 7 | 16 | 11 | 17 | 10 | 1 | 6 | 15 | 12 | 3 | 4 | 2 | 5 | 14 | 13 |
| 6 | 0 | 5 | 12 | 17 | 7 | 2 | 15 | 10 | 16 | 13 | 4 | 1 | 11 | 14 | 3 | 6 |
| 7 | 0 | 15 | 11 | 4 | 1 | 14 | 10 | 5 | 2 | 17 | 13 | 6 | 3 | 16 | 12 | 7 |
| 10 | 0 | 14 | 13 | 7 | 5 | 11 | 16 | 2 | 12 | 6 | 1 | 15 | 17 | 3 | 4 | 10 |
| 11 | 0 | 4 | 10 | 14 | 3 | 7 | 13 | 17 | 6 | 2 | 16 | 12 | 5 | 1 | 15 | 11 |
| 12 | 0 | 6 | 14 | 12 | 13 | 15 | 7 | 1 | 5 | 3 | 11 | 17 | 16 | 10 | 2 | 4 |
| 13 | 0 | 11 | 1 | 10 | 2 | 13 | 3 | 12 | 4 | 15 | 5 | 14 | 6 | 17 | 7 | 16 |
| 14 | 0 | 1 | 2 | 3 | 4 | 5 | 6 | 7 | 10 | 11 | 12 | 13 | 14 | 15 | 16 | 17 |
| 15 | 0 | 0 | 0 | 0 | 0 | 0 | 0 | 0 | 0 | 0 | 0 | 0 | 0 | 0 | 0 | 0 |
| 16 | 0 | 0 | 0 | 0 | 0 | 0 | 0 | 0 | 0 | 0 | 0 | 0 | 0 | 0 | 0 | 0 |
| 17 | 0 | 0 | 0 | 0 | 0 | 0 | 0 | 0 | 0 | 0 | 0 | 0 | 0 | 0 | 0 | 0 |

| ADDRESS | CONTENTS |
|---|---|
| 0 0 | 0 1 |
| 0 1 | 0 2 |
| 0 2 | 0 2 |
| 0 3 | 0 4 |
| 0 4 | 0 2 |
| 0 5 | 0 4 |
| 0 6 | 0 4 |
| 1 0 | 0 2 |
| 1 1 | 0 4 |
| 1 2 | 0 4 |
| 1 4 | 0 4 |
| 2 0 | 0 2 |
| 2 1 | 0 4 |
| 2 2 | 0 4 |
| 2 4 | 0 4 |
| 3 0 | 0 4 |
| 4 0 | 0 2 |
| 4 1 | 0 4 |
| 4 2 | 0 4 |
| 4 4 | 0 4 |
| 5 0 | 0 4 |
| 6 0 | 0 4 |
| 1 0 0 | 0 2 |
| 1 0 1 | 0 4 |
| 1 0 2 | 0 4 |
| 1 0 4 | 0 4 |
| 1 1 0 | 0 4 |
| 1 2 0 | 0 4 |
| 1 4 0 | 0 4 |
| 2 0 0 | 0 2 |
| 2 0 1 | 0 4 |
| 2 0 2 | 0 4 |
| 2 0 4 | 0 4 |
| 2 1 0 | 0 4 |
| 2 2 0 | 0 4 |
| 2 4 0 | 0 4 |
| 3 0 0 | 0 4 |
| ALL OTHERS | 0 0 |

FIG. 15

| ADDRESS | CONTENTS |
|---|---|
| 0 0 | 0 0 |
| 0 1 | 1 0 |
| 0 2 | 1 1 |
| 0 3 | 1 1 |
| 0 4 TO 0 7 | 1 2 |
| 1 0 TO 1 7 | 1 3 |
| 2 0 TO 3 7 | 1 4 |
| 4 0 TO 7 7 | 1 5 |
| 1 0 0 TO 1 7 7 | 1 6 |
| 2 0 0 TO 3 7 7 | 1 7 |

FIG. 16

| ADDRESS | CONTENTS ROM 512 & 514 | ROM 516 |
|---|---|---|
| 0 3 | 0 1 | 0 0 |
| 0 5 | 0 2 | 0 0 |
| 0 6 | 0 1 | 0 0 |
| 1 1 | 0 3 | 0 0 |
| 1 2 | 0 2 | 0 0 |
| 1 4 | 0 1 | 0 0 |
| 2 1 | 0 4 | 1 0 |
| 2 2 | 0 3 | 0 7 |
| 2 4 | 0 2 | 0 6 |
| 3 0 | 0 1 | 0 5 |
| 4 1 | 0 5 | 1 1 |
| 4 2 | 0 4 | 1 0 |
| 4 4 | 0 3 | 0 7 |
| 5 0 | 0 2 | 0 6 |
| 6 0 | 0 1 | 0 0 |
| 1 0 1 | 0 6 | 1 2 |
| 1 0 2 | 0 5 | 1 1 |
| 1 0 4 | 0 4 | 1 0 |
| 1 1 0 | 0 3 | 0 7 |
| 1 2 0 | 0 2 | 0 0 |
| 1 4 0 | 0 1 | 0 0 |
| 2 0 1 | 0 7 | 1 3 |
| 2 0 2 | 0 6 | 1 2 |
| 2 0 4 | 0 5 | 1 1 |
| 2 1 0 | 0 4 | 1 0 |
| 2 2 0 | 0 3 | 0 0 |
| 2 4 0 | 0 2 | 0 0 |
| 3 0 0 | 0 1 | 0 0 |
| ALL OTHERS | 0 0 | 0 0 |

FIG. 17

ERROR CORRECTION ENCODER AND DECODER

STATEMENT OF GOVERNMENT INTEREST

The invention herein described was made in the course of or under a contract or subcontract thereunder with the Department of the Navy.

BACKGROUND OF THE INVENTION

In the process of recording data onto a storage medium (such as magnetic tapes or bubbles and other similar data channels) and subsequently reproducing the data, the recorder/reproducer used, as well as the storage medium itself, may introduce errors. The most usual types of errors occurring in the playback of tape-recorded data result from impurities on or imperfections in the storage medium. The impurities may be dust, bits of oxide, or other extraneous particles on the storage medium which result in a momentary increase in the head-to-storage medium separation with a corresponding decrease in signal strength. The imperfections may be spots with a deficiency of oxide, excess backing, lumps of oxide, or bits of foreign matter incorporated in either the oxide or backing which result in either excessive head separation or a magnetic dead spot. The size of the affected area on the storage medium is generally of the order of or less than the spacing of the tracks, and hence it is usual for errors to occur in only one track at a time. However, the affected spot may cover many bits (hundreds or even thousands) in one track of a high-density digital recording system.

Previously employed methods have generally required the "backing up" and repositioning of the storage medium to the beginning of a record of data in order to detect errors and have required re-reading the record from the storage medium for error-correction. These requirements which are common in prior art systems, such as the well-known nine-track tape ASCII system, further require that there be gaps on the tape between successive records, a significantly negative feature where high-density packing is sought.

Some error-correction systems have been designed to correct burst errors, such as U.S. Pat. No. 3,478,313 and U.S. Pat. No. 3,859,630; however, they do not have the capabilities of continuously correcting a burst error of indeterminate length along a storage medium without the need for re-reading the record or leaving gaps.

Finally, no prior art apparatus or method discloses the positioning of parity bytes along a magnetic tape or such other storage medium track while encoding the data across the tracks of such storage medium.

SUMMARY OF THE INVENTION

The present invention overcomes the above-stated disadvantages by providing an error-correction encoder (ECE) and decoder (ECD) which can continuously eliminate errors occurring in conveyed data.

The invention achieves this end by associating synchronous characters of data which are recorded onto and later reproduced from a storage medium into data blocks measured across and along the tracks of the storage medium. The encoding and decoding, according to the invention, are directed to rectifying errors in these data blocks. Such formatting of data enhances the error-correcting power of the present apparatus by providing correction for the maximum number of errors with a maximum data bit-to-parity bit ratio being attainable.

As a result of this encoding and decoding technique, an enhanced Bit Error Rate (BER), defined as errors per transmitted bits, is also achievable. For example, in a standard 14-track tape the BER is generally on the order of 1-in-$10^6$. Correction of errors by the present invention has decreased the BER to approximately one error in $10^{11}$ transmitted bits.

The present coding technique permits the writing of parity bits generated according to the code onto lines distinct from and parallel to those carrying data, thereby making it possible to pass data through the ECE and ECD unaltered, without any error detection or correction being performed.

The present invention, in effect, transfers data through various sequential stages of encoding and decoding without the necessity for any interruption in data transfer, thereby permitting continuous error correction without the necessity for gaps in the recorded data. These stages are summarized as follows.

Data enters the ECE through an input buffer stage. A timing and control unit, by providing clock pulses to the input buffer stage, causes a character to exit from the input buffer stage on each pulse. The characters enter buffer storage registers and are formatted by the timing and control unit into data blocks, each of which includes a preset number of the serially input characters of data.

The entering of characters might look as shown in FIG. 6 where, for example, there are four serially input characters per data block, with each character having 12 bits. Annexed to each character are parity bits shown in FIG. 7 carried on parity lines which are parallel to the data lines. The parity bits are derived by parity generators which perform certain bit-value pattern checks on each data block. Because the value of some parity bits depends on the values of bits in the data block rather than in just a single character, output parity information is in the form of bytes which are comprised of a series of bits. The combined output of the data block with parity bytes annexed is referred to as a "code word".

The ratio of data bits to parity bits in each code word depends on the number and types of errors to be corrected as well as how the parity information is generated. A simplified explanation of the coding theory employed by the present invention illustrates how the present invention enhances the data-to-parity ratio while providing significant error-correcting power.

Assume a data block contains binary data arranged in four columns with 12 bits in each column. Also assume there are eight parity bits available for error-checking. Each column can then be allotted two parity bits. Four (that is, $2^2$) different types of error can be represented by the parity bits allotted to each 12-bit column, if the parities are limited to checking for errors in but one column. Such parity allocation exemplifies binary coding wherein elements used in such codes are limited to two possible states. For the four columns of 48 bits, intuition dictates that 16 (four columns $\times$ $2^2$ types of errors per column) errors can be represented according to the normal binary code. However, if, as in the present invention, all eight bits are examined together as a parity "byte" to generate error representations for all four columns examined together as a single data block, 256 ($2^8$) distinct error representations are available as compared to the sixteen of the normal binary method. Much more error-correcting power is thus realized with the same number of parity bits. The coding of the present invention is referred to as non-binary coding where elements having more than two possible states are employed. This elementary theoretical consideration embodied in the present invention is included with other mathematical and coding theory considerations which drive the actual error-correcting potential of the present Error-Correction Encoder/Decoder Device toward the theoretical error-correction limit.

The Error-Correction Decoder (ECD) reads and corrects code words (which may contain errors) received on playback from a recording/reproducing system (shown later in FIG. 1). As is conventional, the ECD follows the general procedure of determining a syndrome, finding a probable error pattern, and then correcting the appropriate error if possible. However, in determining and using the syndromes, to detect and correct errors, significant and unique departures over the prior art are evident.

Code words initially enter the ECD through a storage unit. The code words then enter a syndrome calculator which generates a syndrome computed by logically combining selected data and parity bits. The syndrome is fed into error correction storage or information circuits comprised of read-only memories (ROMs) or other logic elements, such as gates, which use the syndrome as an address to stored error patterns. The ROMs are programmed to output error detection or error correction information which corresponds to a given syndrome input. The error-correction information is decoded to produce signals which indicate the data line (or lines) to be corrected. The signals then enter correction circuits together with the corresponding code word, wherein the detected errors are corrected on the appropriate data line (or lines). After correction, the exiting data block should be identical, within greatly enhanced Bit Error Rate (BER) limits to the data entering the ECE.

If errors are detected which are not correctable, the aforementioned error detection information is decoded to provide an error bit that is buffered and put out with the data. An error bit is also entered into an error counter which indicates how many uncorrectable errors remain unaltered in the exiting data.

To further augment the correction power of the Error-Correction Encoder/Decoder device, a data quality check referred to as an erasure correction feature is included as an operational mode. When in the erasure correction mode, a separate check of the quality of the data carried on each data line is made. Data quality information is generated by a Playback Digital Interface (PDI) which conveys the information to the ECD through a data quality logic unit. In the data quality logic unit, the data quality information is formulated into functions which indicate the number and locations of tracks that have a high probability of containing data with errors. The data quality functions are applied to erasure correction circuit ROMs. The ROM outputs are used to determine error patterns based on data quality information. These patterns are then compared with the error information generated from parity checks alone. The comparison provides information about whether to correct the data on the lines indicated by the data quality or to indicate a detected but uncorrectable error. The uncorrected errors are counted, the count being displayed if desired.

All data, data quality, error and syndrome information are transmitted synchronously to a processor.

An example of the error-correcting power of the present invention is found in the (14,12) code, wherein 14 represents the total number of data and parity lines while 12 represents the number of data lines. This code is described later as a preferred embodiment. Other embodiments such as a (28,26) code or a (33,31) code or a (42,40) code or a (9,7) code are also within the scope of the present invention for single-track, burst error applications.

It is, however, also to be noted that coding across a storage medium and writing parity bits onto separate and distinct tracks for correcting burst errors on a plurality of tracks is also within the scope of the invention as well. To be sure, the following table illustrates the types of burst errors correctable with both the (14,8) and (14,12) codes, respectively, with and without the use of the aforementioned erasure correction feature.

| Correction Capabilities of Different Embodiments of the Present Invention | |
|---|---|
| Code/Mode | Type of Data Burst Errors Corrected |
| (14,8) Error Correction | Three adjacent track errors |
| | Two adjacent track errors |
| | Two track errors separated by one good track |
| | Single track errors |
| | Double errors, parity tracks 0 and 13 (no error indication) |
| (14,8) Erasure Correction | Single track error, where the track number matches the data quality line indicating "bad data" or matches one of two data quality lines indicating "bad data". |
| | Any two track errors where the track numbers match the data quality lines indicating "bad data". |
| (14,12) Error Correction | Byte errors on any single data track (a byte error can be one of the 15 non-zero combinations of the 4 bits). |
| (14,12) Erasure Correction | Single byte errors on any single data track, where the track number matches the data quality line indicating "bad data", or the track number matches either one of two data quality lines indicating "bad data". |
| | Two byte errors on any two tracks where the track numbers match the data quality lines indicating "bad data". |

BRIEF DESCRIPTION OF THE DRAWINGS

FIG. 8 is a list of non-zero elements of a Galois Field GF(16) generated as powers of $\alpha$ where $\alpha$ is a root of the primitive polynomial $X^4+X+1=0$ over a field of two elements;

FIG. 9 is a table showing the contents of ROM 406;

FIG. 13 is a table listing the contents of ROM 522;

FIG. 14 is a table listing the contents of ROM 528;

FIG. 15 is a table listing the contents of ROMs 502 and 504;

FIG. 16 is a table listing the contents of ROMs 508 and 510;

FIG. 17 is a table listing the contents of ROMs 512, 515, and 516.

ONE ENVIRONMENT OF THE INVENTION

Figure 1:
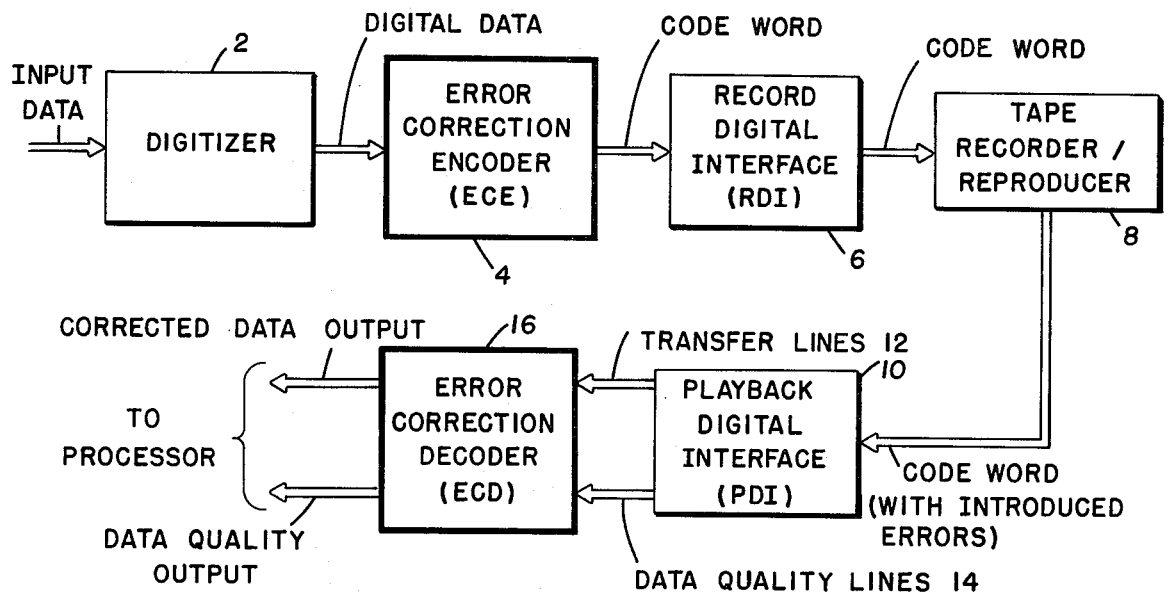
FIG. 1 shows one environment in which the Error-Correction Encoder (ECE) of the present invention may be employed.

The Error-Correction Encoder/Decoder (ECE/ECD) can be employed in an environment known in the art as a high-density digital recording and reproducing system (referred to as an HDDRRS) as seen in FIG. 1. The HDDRRS receives input data in the form of analog signals. The signals enter digitizer 2 from which digital data is fed to the Error-Correction Encoder (ECE) 4 of the present invention which adds parity bits to the data to produce code words. The code words enter a conventional record digital interface (RDI) 6 which prepares the coded data for recording by a recorder/reproducer or other channel 8. The code words are subsequently played back through a playback digital interface (PDI) 10 with possible errors introduced during the recording and reproduction of the code words. The PDI 10 transfers the code words onto information transfer lines 12 corresponding to the tracks of the tape or other storage medium used in the recording. Data quality outputs are produced by the PDI 10 and are conveyed on separate parallel lines 14 which correspond, on a one-to-one basis, with the storage medium tracks. For each track, then, there is an associated information transfer line which carries either parity or data information and a data quality line which conveys data quality information. All the transfer lines 12 and data quality lines 14 from the PDI 10 enter the Error-Correction Decoder (ECD) 16 of the invention. The ECD 16 examines the code words alone or the code words together with the data quality signals to detect and correct errors introduced into the original input data usually during the recording or reproduction. The corrected, decoded data is then sent to a processor (not shown), with accompanying data quality information.

GENERAL DESCRIPTION OF THE INVENTION

Figure 2:
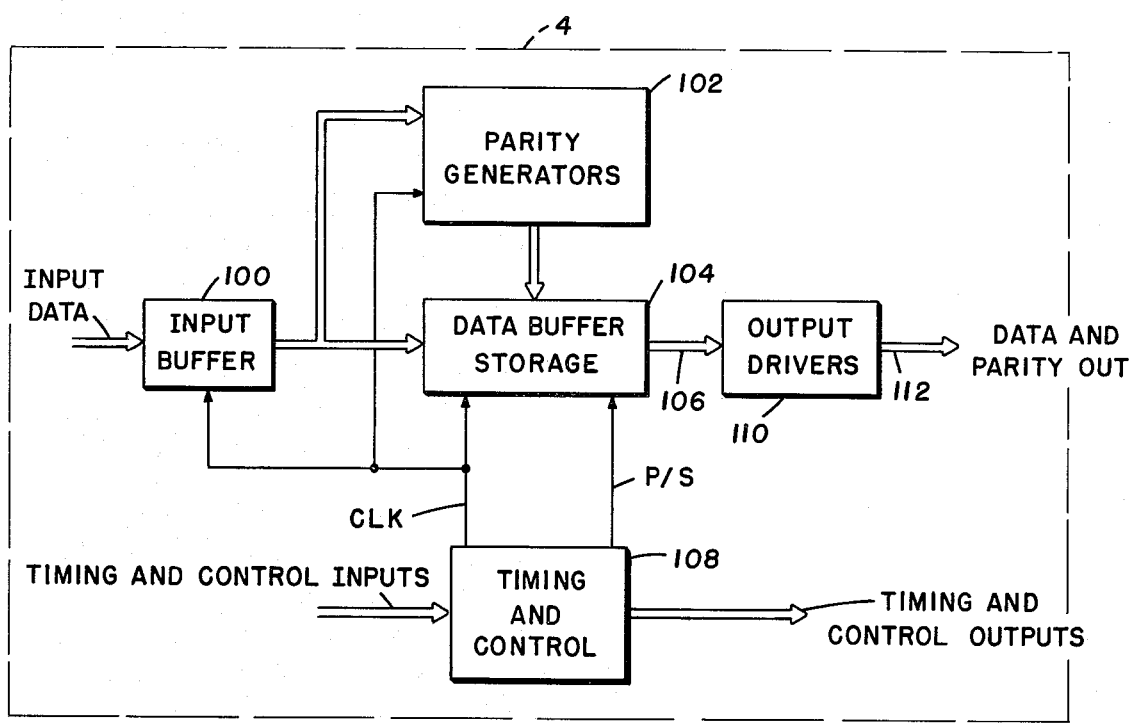
FIG. 2 is a simplified block diagram of the ECE according to the present invention.

Referring to FIG. 2, a simplified block diagram of an Error-Correction Encoder (ECE) 4 according to the present invention is shown. Input to the ECE 4 includes a plurality of parallel input data lines carrying raw data from an external source (not shown). The data enters an input buffer stage 100 where it is made compatible in voltage level and impedance with the ECE 4. The data is then conveyed simultaneously to parity generators 102 and to a data buffer storage stage 104. The parity generators 102, according to later discussed coding logic, produce parity bytes (or $m$-tuples) by the modulo-2 addition of various selected bits of data. Each parity byte comprises a plurality of selectively generated parity bits. The data buffer storage stage 104 simply stores the data until the parity bytes have been generated. The parity bytes are entered onto parity lines which run parallel to the data lines, all of which are shown together as lines 106. The aligning and synchronizing of the data and parity bytes carried respectively on the data lines and parity lines 106 is accomplished by timing and control element 108. The data and generated parity bytes are conveyed along the data and parity lines 106 which feed output drivers 110 which put out, on lines 112, the code words to be recorded.

Figure 3:
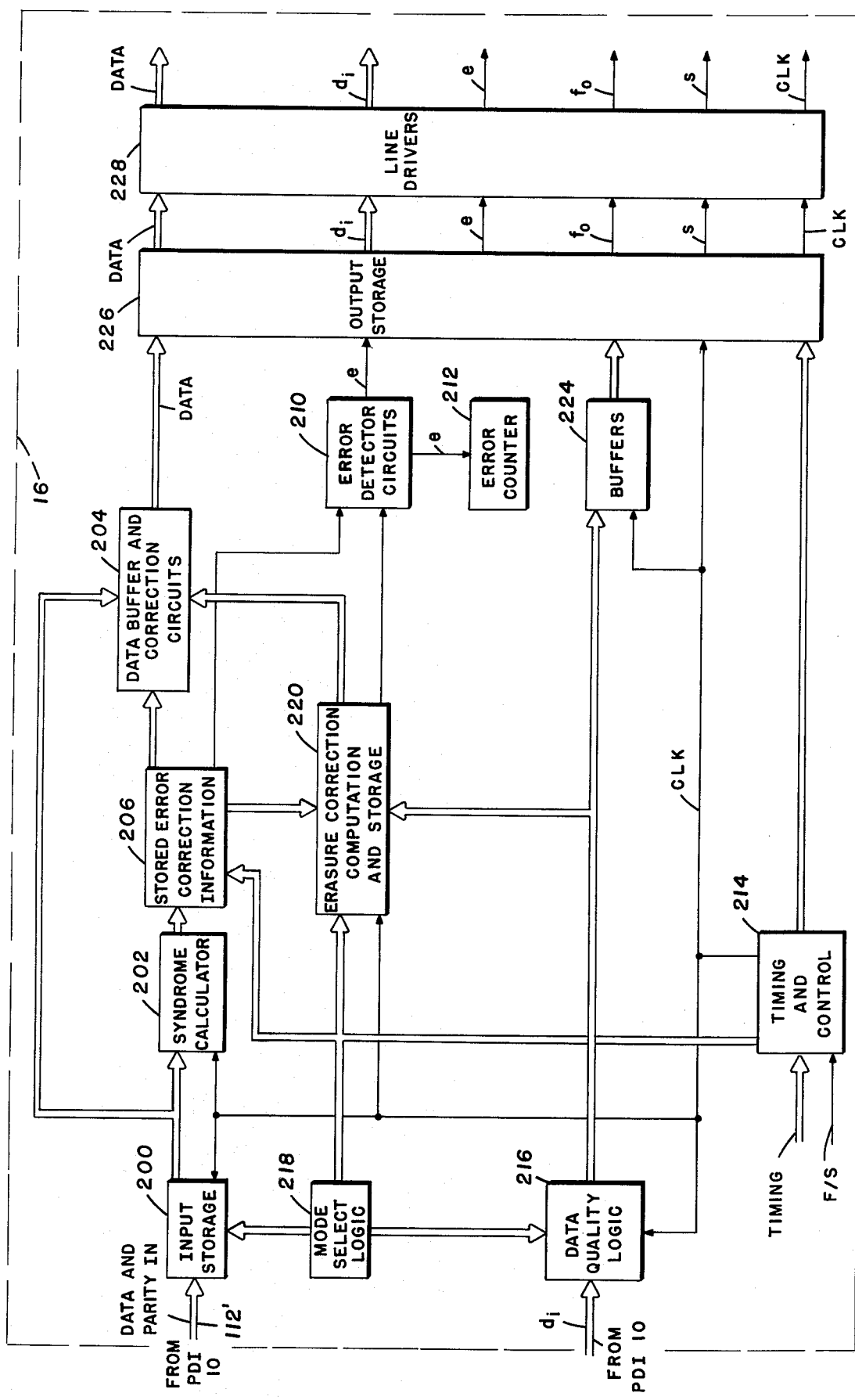
FIG. 3 is a simplified block diagram of the ECD according to the present invention.

Reference is now made to FIG. 3 which represents a simplified block diagram of an Error-Correction Decoder (ECD) 16 according to the present invention. Input to the ECD 16 included code words (which may have errors) carried along a plurality of parallel data lines and parity lines 112' from the PDI 10 of FIG. 1 which enter an input storage stage 200. From the input storage stage 200, the reproduced code words with introduced errors are sent to a syndrome calculator 202 and a data buffer and correction circuit 204. If errors are present in the information, a non-zero syndrome is generated. The syndrome is used to address stored error correction circuits 206 which inform the buffer and correction circuit 204 which byte (or bytes for the multiple-track burst error correction mode) in the reproduced code word are in error and should be corrected. Provision is also made in the ECD 16 for determining some uncorrectable errors. Such errors are detected by error detector circuits 210 and counted in an error counter 212. Timing functions are generated by a timing and control unit 214 which operates in a manner similar to the timing and control unit 108 of the ECE 4 (of FIG. 2). A frame synch pulse F/S from the PDI 10 (of FIG. 1) coordinates the encoding and decoding steps of the invention by associating the data entering the ECD 16 into code words identical (except for introduced errors) to those exiting the ECE 4.

A special feature of the ECD 16 is referred to as an erasure correction mode. The erasure correction mode employs data quality logic circuitry 216 which is activated by mode select logic circuitry 218 and which alternatively switches between simple error correction mode (without the erasure correction feature) and erasure correction mode depending on whether data quality signals $d_i$ from the PDI 10 (shown in FIG. 1) are present. Referring again to FIG. 3, the data quality signals $d_i$ shown are used to generate data quality functions. These functions indicate the number and location of tracks having a high probability of containing information with errors. Once the data quality information is generated, the ECD 16 automatically switches into the erasure correction mode if mode select logic 218 is in the erasure correction mode position. Syndromes based on parity information and on data quality information are, in the erasure correction mode, computed to enhance the error-correcting capabilities of the present invention. The syndromes are evaluated in erasure correction computation and storage circuitry 220. As in the simple error correction mode, error information is conveyed to data buffers and correction circuitry 204 which amends the erroneous data bits and prepares the data to be output. Uncorrectable detected errors "$e$" in the erasure correction mode are detected and counted in the error detector circuitry 210 and error counter 212, respectively, as in the simple error-correction mode. The data quality information from the PDI 10 (of FIG. 1) is conveyed to the output through buffers 224.

An output storage element 226 and line drivers 228 serve to synchronously transmit data, data quality $d_i$, error $e$, and syndrome $S$ information to an external processor (not shown in the figures) along with clock pulses CLK emanating from the decoder timing and control 214. A function output $f_0$ is also provided which indicates if any of the data lines carry poor quality information.

GENERAL SCOPE OF THE INVENTION

Figure 4:
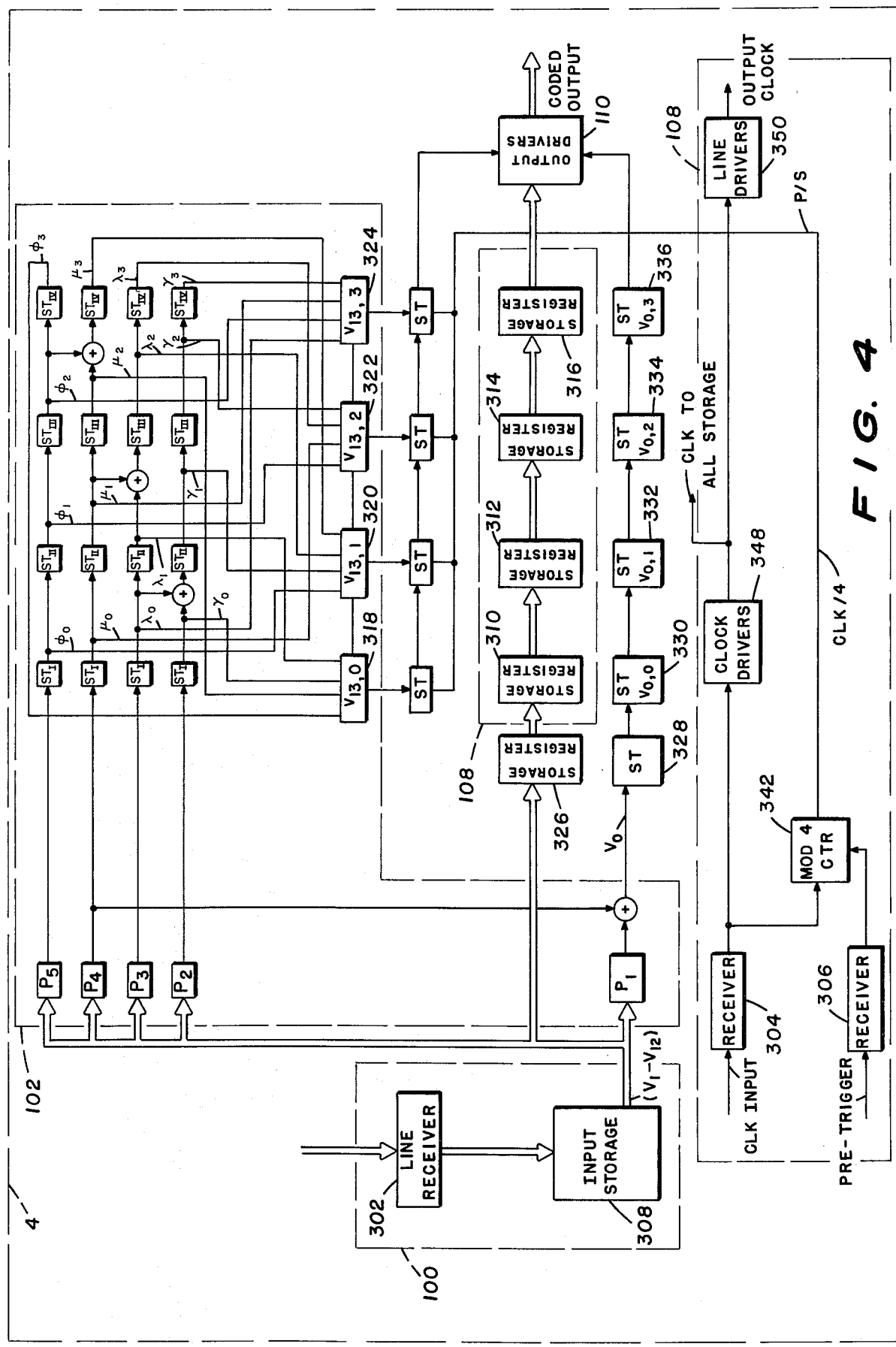
FIG. 4 is a detailed block diagram of the ECE implementing a (14,12) code according to the present invention.
Figure 5A:
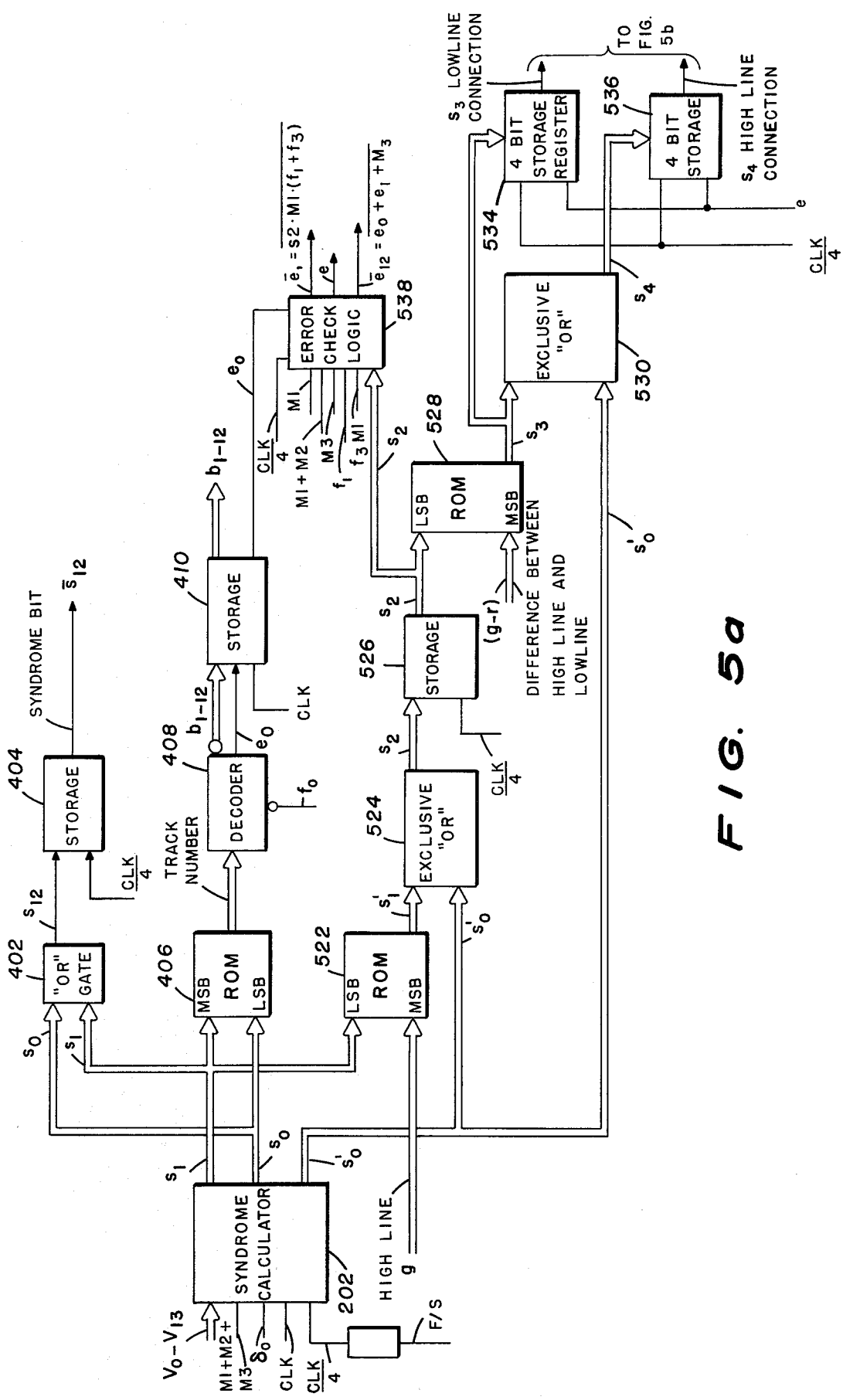
FIGS. 5a and 5b are detailed, interconnected block diagrams of the ECD as implemented for an example (14,12) code according to the present invention.
Figure 5B:
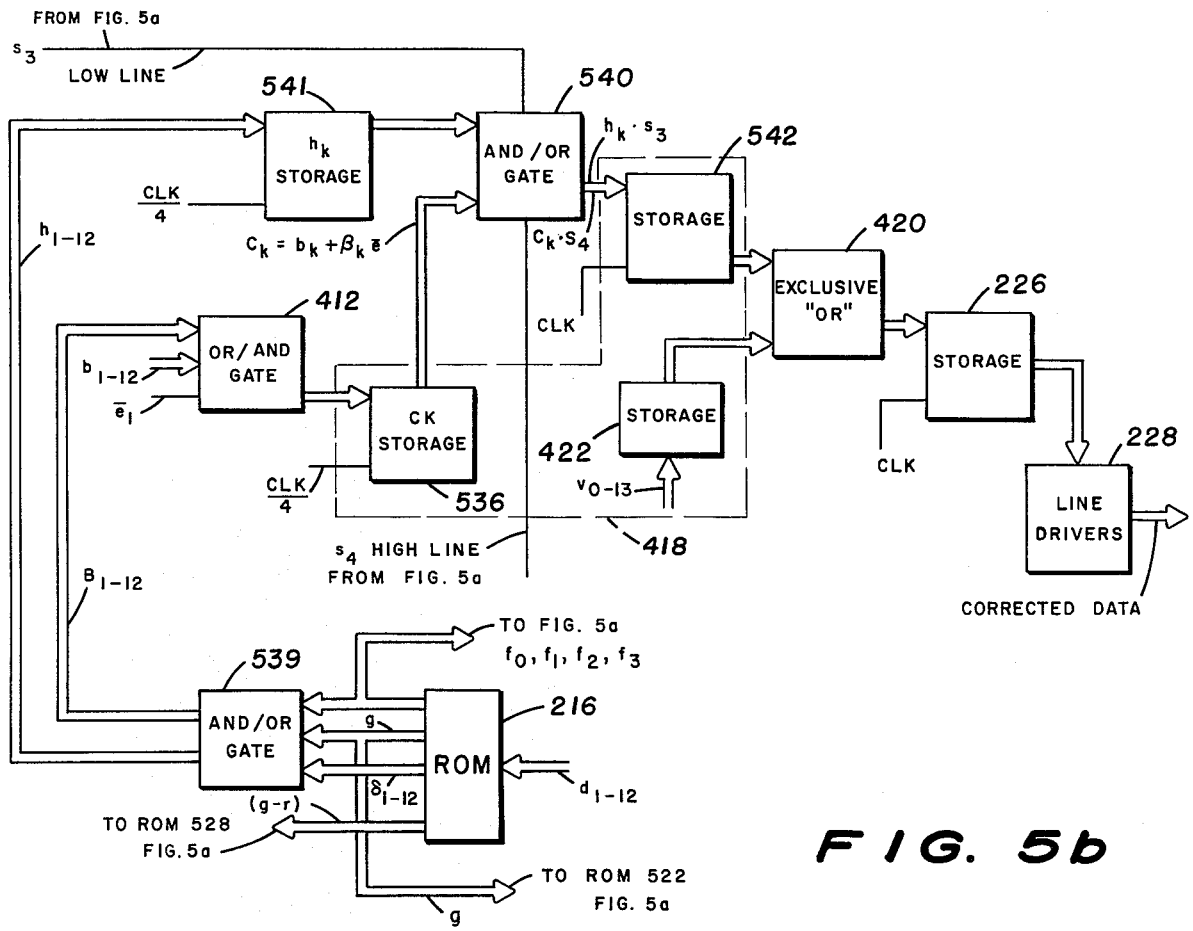

A preferred embodiment of the invention is shown in FIG. 4 which illustrates in detail the operation of the ECE 4 and FIGS. 5a and 5b which illustrate the detailed operation of the ECD 16. The circuitry shown is an implementation of a (14,12) generalized Hamming code and the theory related thereto [see *Error-Correcting Codes* by Peterson and Weldon (second edition, 1972)].

It should be noted that other codes can be similarly implemented which employ generalized coding, such as generalized BCH codes. To be sure, the present invention can employ a variety of $(n,k)$ codes over a field of $q$ elements. The relationship between $n$ (the combined number of data lines plus parity lines), $k$ (the number of data lines), and $q$ (the number of distinct symbols employed or elements in the field) is conventional as applied to codes of various types. The theory related to such codes is best represented by rewriting, in inverse form, equation (4.12) found in *Error-Correcting Codes*, page 83, as follows:

$$q^{(n-k)} \geq 1 + \binom{n}{1}(q-1) + \ldots \binom{n}{t}(q-1)^t \quad (1)$$

where $t$ is the number of tracks which can contain errors to be corrected. Where only one track is to be correctable, i.e., $t = 1$, and there are two parity lines, $(n-k) = 2$, the equation simplifies to:

$$q^2 \geq 1 + (n)(q-1) \text{ or}$$

$$n \leq q + 1. \quad (2)$$

Defining a code word as having an $m$-bit length along the lines and an $n$-bit dimension across the lines, $q$ can be mathematically defined as $2^m$ field elements. Taking $m = 4$, code words comprised of binary 4-tuples, or 4-bit bytes, taken from a 16-element field are generated. The highest order $(n,k)$ code which could be accommodated with the above values for $t$, $m$, and $(n-k)$ would be a (17,15) code where $n = 16 + 1$ as determined in Equation (2). With $m$ increased to five, $q = 2^5 = 32$; $n$ would become 33 and a (33,31) code would be possible. Physically, this means, that if the byte size is increased from $m = 4$ to $m = 5$, the number of data lines which could be accommodated for single-track error-correction increases to 31 from 15.

The above-described theory is implemented by matching parity combinations with possible error patterns. Assuming $m = 4$, each 4-tuple byte along a data line can have any one of 15 possible error patterns; one 4-tuple byte combination representing the correct, no-error information. Where there are seventeen lines, the number of total burst error patterns in a code word is 255 or, that is, fifteen possible errors in a line times 17 lines. With eight parity bits, there ae 256 parity combinations. A parity combination can thuse be matched to each error pattern. Of course, if $n$ is chosen to be 14, errors are likewise correctable where the 256 parity combinations need be directed to only 210 possible errors.

In the preferred embodiment to be described, $n$ is selected as 14. This less powerful (14,12) code is described instead of a (17,15) code because many standard tape recorder/reproducers (see FIG. 1) presently found on the market only have 14 tracks. It should, however, be understood that (17,15), (16,14) . . . codes are, of course, equally available for implementation in accordance with the present invention. Further, as discussed previously, the invention also contemplates setting $m$ equal to other positive integers, such as five, six, et cetera thereby controlling the theoretical error-correction power of the invention. That is, with $m = 5$, there are 31 possible error patterns in a single track and 10 parity bits which provide $2^{10}$, or 1,024, parity combinations. The division of the 1,024 parity combinations by 31 error patterns per track produces the result that 33 tracks can be handled for single track correction, as shown previously by theory. That is, (33,31), (30,28), (28,26) . . . codes could be accommodated.

Further, an enhancement of error-correcting capabilities is achievable by increasing the number of parities in the codes, i.e., increasing $(n-k)$, as mentioned in the Summary of the Invention with reference to a (14,8) code. Increasing $(n-k)$ with all other variables remaining constant causes an increase in $t$, the number of tracks wherein burst errors can be corrected. As seen in the table in the Summary of the Invention, the (14,12) code can correct only single-track errors with $(n-k) = 2$ in the error correction mode, whereas the (14,8) code with $(n-k) = 6$ can correct some triple-track errors as well as some double-track and all single-track burst errors. Altering the invention to conform to various $(n-k)$ values is within the contemplation of the invention as claimed.

Other parameters of the general equation may also be altered within the teachings of the invention. For example, with tri-state storage medium elements, $q$ would take on values of $3^m$ rather than $2^m$ which is now more conventional.

DESCRIPTION OF A PREFERRED EMBODIMENT FOR A (14,12) CODE ENCODER (ECE)

Referring now to FIG. 4, the implementation of a (14,12) general Hamming code is described. Data, a synch clock pulse, and a pretrigger enter the ECE 4 on line receivers 302, 304, and 306, respectively, which shape the incoming data and time information. From the line receivers 302, the data bits are buffered through input storage elements 308 and are then stored as data blocks measuring four bits, or one byte, along data lines labelled as $V_1$ through $V_{12}$ by 12 bits across the data lines. (See FIG. 6). This blocking occurs in the data buffer storage unit 108 wherein the storage of four 12-bit characters of data takes place over a period of four succeeding clock pulses. With each clock pulse, each 12-bit character is transferred to a latter storage stage, shown by shift registers 310, 312, 314 and 316, in the direction of the thick data flow arrows in FIG. 4.

While the data enters the registers 310, 312, 314 and 316 of data buffer storage unit 108, the data also selectively enter parity generators 102, through exclusive -OR modulo-2 adders $P_1$ through $P_5$. $P_1$ through $P_5$ perform modulo-2 additions (represented by the symbol $\oplus$ on the incoming data $v_1$ through $v_{12}$ (from data lines $V_1$ through $V_{12}$, respectively) to produce parity bits $p_1$ through $p_5$ as follows:

$$p_1 = v_1 \oplus v_2 \oplus v_4 \oplus v_5 \oplus v_8 \oplus v_{10} \quad (3)$$

$$p_2 = v_1 \oplus v_5 \oplus v_8 \oplus v_9 \oplus v_{11}$$

$$p_3 = v_4 \oplus v_7 \oplus v_8 \oplus v_{10} \oplus v_{12}$$

$$p_4 = v_3 \oplus v_6 \oplus v_7 \oplus v_9 \oplus v_{11} \oplus v_{12}$$

$$p_5 = v_2 \oplus v_5 \oplus v_6 \oplus v_8 \oplus v_{10} \oplus v_{11} \oplus v_{12}.$$

It should be noted that data lines and adders are labelled in uppercase letters, e.g., $V_1$ through $V_{12}$ and $P_1$ through $P_5$, while bits and bytes of information associated with the appropriate line, adder, or similar apparatus is labelled in lowercase lettering, e.g., $v_1$ through $v_{12}$.

A new character comprised of $v_1$ through $v_{12}$ bits enters modulo-2 adders $P_1$ through $P_5$ with every clock pulse. From the modulo-2 adders $P_1$ through $P_5$, the parity bits $p_1$ through $p_5$ are passed, in synchronous fashion, through successive storage elements $ST_I$, $ST_{II}$, $ST_{III}$, and $ST_{IV}$ and are, at the same time, combined by modulo-2 addition in a selected manner to yield output parity bits, shown in FIG. 4 as $v_{13,0}$ through $v_{13,3}$ in a general $v_{i,j}$ format. The first subscript, $i$, relates to the data line on which the output parity information is carried. $v_{0,j}$ and $v_{13,j}$ represent output parity information conveyed along lines $V_0$ and $V_{13}$, respectively, which flank the data-carrying lines $V_1$ through $V_{12}$. The second subscript, $j$, indicates the 12-bit character onto which output parity bits are to be tagged. $v_{13,0}$ represents the output parity bit which is carried on parity line $V_{13}$ and which is tagged onto the most recent character in the data block; $v_{13,3}$ represents the output parity bit on parity line $V_{13}$ which is tagged onto the earliest-entered, oldest character in the data block, which is in the final stage of storage $ST_{IV}$.

Examining parity generators 102 more closely, lines following each storage stage $ST_I$ through $ST_{IV}$ are provided to carry intermediate parity values, $\gamma_j$, $\lambda_j$, $\mu_j$ and $\phi_j$, obtained over the four clock periods during which the output parities $v_{13,j}$ are generated. The proper selection and modulo-2 addition of intermediate parity values $\gamma_j$, $\lambda_j$, $\mu_j$, and $\phi_j$ in generating the $v_{13,j}$'s is shown by the connection inputs to the $v_{13,j}$ generators 318, 320, 322, and 324.

The $v_{0,j}$'s are represented mathematically as:

$$v_{0,j} = \sum_{i=1}^{12} v_{i,j} \bmod 2 \text{ (where } j = 0,1,2,3) \quad (4)$$

which indicates that $v_0$ at a time corresponding to $j$ is simply the modulo-2 addition of all data bits comprising the $j$th character in the data block. In FIG. 4, $v_0$ is shown as:

$$v_0 = p_1 \oplus p_4 \quad (5)$$

with no further additions. The $v_0$ output parities are simply parity checks across the data lines $V_1$ through $V_{12}$ for each character.

For purposes of clarification, it should be noted that parities have a single or double subscript depending on whether consideration of the $j$ subscript is apposite.

Where parities are generated from information occurring at different clock periods, the $j$ subscript is included; where parities are considered in a single clock period frame, the $j$ subscript is omitted.

The output parity bits $v_{0,j}$ and $v_{13,j}$ ($j = 0,1,2,3$), once generated, are annexed onto the data block in corresponding storage elements ST which are aligned with the storage registers 310, 312, 314 and 316 contained in the data buffer storage unit 108. Storage registers 326 and 328 are required to delay the data and the $v_0$ values one clock period while the $v_{13}$ output parities are being generated.

The data blocks annexed with the corresponding generated parity bits are code words. Each code word, in this embodiment, is thus comprised of 14 4-tuple bytes or 56 bits.

These code words exit the ECE 4 through output drivers 110 whereupon they enter a 14 (or more) track recorder/reproducer for recording onto a magnetic medium (see FIG. 1).

By way of example, assume that a 12-bit character, $v_1 \ldots v_{12}$ equal to 111111000001, enters the modulo-2 adders $P_1$ through $P_5$ from the input storage stage 308. The generated parities, according to Equations (3), will be:

$$p_1 = 1 \oplus 1 \oplus 1 \oplus 1 \oplus 0 \oplus 0 = 0$$

$$p_2 = 1 \oplus 1 \oplus 0 \oplus 0 \oplus 0 = 0$$

$$p_3 = 1 \oplus 0 \oplus 0 \oplus 0 \oplus 1 = 0$$

$$p_4 = 1 \oplus 1 \oplus 0 \oplus 0 \oplus 0 \oplus 1 = 1$$

$$p_5 = 1 \oplus 1 \oplus 1 \oplus 0 \oplus 0 \oplus 0 \oplus 1 = 0$$

The parities, $p_2$ through $p_5$, enter first stage storage elements $ST_I$. Parities $p_1$ and $p_4$ are, at the same time, modulo-2 added with the result being stored in storage elements 328 as a $v_0$ parity. $v_0$ is associated with the 12-bit character of the example, which is in register 326. The 12-bit character is then shifted into the next stage of storage elements 310 in response to a clock pulse CLK. $v_0 = p_1 \oplus p_4$ is transferred into a storage element 330 where it is temporarily stored as $v_{0,0}$. (The second subscript, it should be recalled, refers to which character the generated $v_0$ is to be annexed.) $v_{0,0}$ by its definition $p_1 \oplus p_4$ is $0 \oplus 1 = 1$. On the next clock pulse, the value in storage element 330 is shifted to the next storage element 332 where it is temporarily stored in the $v_{0,1}$ parity bit position, the value stored in storage element 332 equal to 1. $v_{0,0}$ then takes on the output parity value $p_1 \oplus p_4$ corresponding to the next 12-bit character, and so on. As the data shifts from register 310 to 312 to 314 to 316 the associated $v_0$ parity shifts simultaneously from storage element 330 to 332 to 334 to 336.

The generation of parity $v_{13,j}$ is more involved than that for $v_{0,j}$. Parities $p_2$ through $p_5$ enter first stage storage elements $ST_I$ from which they are shifted on the next clock pulse from clock CLK. The outputs from the first stage storage elements $ST_I$ are labelled $\gamma_0$, $\lambda_0$, $\mu_0$, $\phi_0$ as seen in the figure and referred to as intermediate parity values. Accordngly, the values in the above example are:

$$\gamma_0 = p_2 = 0; \lambda_0 = p_3 = 0; \mu_0 = p_4 = 1; \phi_0 = p_5 = 0$$

On the next clock pulse, the value of $\gamma_0$ is modulo-2 added to the value of $\lambda_0$ whereupon it is stored in a second stage storage element $ST_{II}$, the output from which is represented as $\gamma_1$. The outputs from the remaining second stage storage elements $ST_{II}$ are similarly subscripted as $\lambda_1$, $\mu_1$, and $\phi_1$. In the succeeding stages of storage elements, the subscripts for $\gamma$, $\lambda$, $\mu$, and $\phi$ are similarly incremented to correspond to successive clock pulse times. It should be noted that a number of modulo-2 additions occur during the shifting of parities to later storage stages. In particular, $\lambda_2 = \lambda_1 \oplus \mu_1$ and $\mu_3 = \mu_2 \oplus \phi_2$ as well as the aforementioned $\gamma_1 = \gamma_0 \oplus \lambda_0$. At a clock pulse which shall be called clock I, the $\gamma_0$; $\lambda_0$, $\mu_0$, and $\phi_0$ values of the above example (specifically 0, 0, 1, 0), corresponding to the character 111111000001, are generated. At the next clock pulse, clock II, the values $\gamma_1 = \gamma_0 \oplus \lambda_0 = 0$, $\lambda_1 = \lambda_0 = 0$, $\mu_1 = 1$ and $\phi_1 = 0$ are generated while new values for $\gamma_0$, $\lambda_0$, $\mu_0$ and $\phi_0$ are generated corresponding to the entry of a new 12-bit character into modulo-2 adders $P_1$ through $P_5$. At clock III, $\gamma_2 = \gamma_1 = 0$, $\lambda_2 = \lambda_1 \oplus \mu_1 = 1$, $\mu_2 = \mu_1 = 1$, and $\phi_2 = \phi_1 = 0$ are generated while $\gamma_1$, $\lambda_1$, $\mu_1$, and $\phi_1$ are replaced by new values. Finally, at clock IV, $\gamma_3 = \gamma_2 = 0$, $\lambda_3 = \lambda_2 = 1$, $\mu_2 \oplus \phi_2 = 1$, and $\phi_3 = \phi_2 = 0$ are generated. It can be seen that at any given clock time there are four 12-bit characters in various stages of encoding in the parity generators 102.

A pulse one bit-time wide is provided every four clock-times on control line P/S to indicate that the $v_{13,j}$ parities have been computed and are ready to be parallel loaded into their respective storage elements ST. On the next clock pulse the data block which was used for computing the $v_{13,j}$ parities is shifted into storage registers 310, 312, 314 and 316 and, at the same time, the $v_{13,j}$ parities are parallel loaded into their storage elements ST. The P/S control line receives its input from a modulo-4 counter 342 which is originally initialized by a pre-trigger pulse which originates in the RDI 6. The pre-trigger pulse is required to synchronize the blocks of encoded information with the RDI 6 (of FIG. 1).

The shaped clock pulses CLK are fed through clock drivers 348 en route to storage elements and output line drivers 350 which put out an output clock signal.

To produce the output parity bits $v_{13,j}$ from the intermediate parity values labelled as subscripted $-\gamma$, $\lambda$, $\mu$, and $\phi$, generators 318, 320, 322, and 324 perform modulo-2 additions (shown below in Table I) between the intermediate parity values generated from the four inputted characters comprising a data block.

Table I $v_{13,0} = \gamma_0 \oplus \lambda_1 \oplus \mu_2 \oplus \phi_3$
$v_{13,1} = \gamma_1 \oplus \lambda_2 \oplus \mu_3 \oplus \phi_0$
$v_{13,2} = \gamma_2 \oplus \lambda_3 \oplus \mu_0 \oplus \phi_1$
$v_{13,3} = \gamma_3 \oplus \lambda_0 \oplus \mu_1 \oplus \phi_2$ From the above table it can be noted that the $v_{13,j}$ output parities represent checks of bits across the lines of data in each data block.

Table II shows the parities $p_1$ through $p_5$ generated by the modulo-2 adders $P_1$ through $P_5$, according to Equations (3), where the four successive characters have, by way of example, the following respective $v_1 \ldots v_{12}$ values: 000000000001 (most recently entered), 010101010101, 111111111111, and 111111000001 (first character entered).

Table II

| $p_5$ | $P_4$ | $P_3$ | $P_2$ | $p_1$ | |
|---|---|---|---|---|---|
| 0 | 1 | 0 | 0 | 0 | first character |
| 1 | 0 | 1 | 1 | 0 | second character |
| 1 | 0 | 0 | 1 | 0 | third character |
| 1 | 1 | 1 | 0 | 0 | fourth character |

Figure 6:
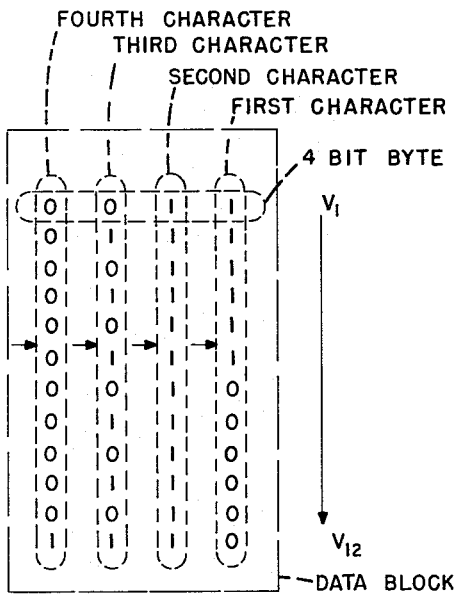
FIG. 6 is an illustration showing the grouping of data into data blocks which are encoded and decoded across the lines or tracks carrying the data.

These example characters are shown in FIG. 6 as a block of data.

Table III shows the computed values for subscripted-$\phi$, $\mu$, $\lambda$, and $\gamma$ over time, as the characters flow through the successive stages of parity generators 106.

Table III

| | $\phi_0(=p_5)$ | $\mu_0(=P_4)$ | $\lambda_0(=p_3)$ | $\delta_0(=p_2)$ | $\phi_1$ | $\mu_1$ | $\lambda_1$ | $\delta_1$ | $\phi_2$ | $\mu_2$ | $\lambda_2$ | $\delta_2$ | $\phi_3$ | $\mu_3$ | $\lambda_3$ | $\delta_3$ |
|---|---|---|---|---|---|---|---|---|---|---|---|---|---|---|---|---|
| Clock I | 0 | 1 | 0 | 0 | | | | | | | | | | | | |
| II | 1 | 0 | 1 | 1 | 0 | 1 | 0 | 0 | — | — | — | — | — | — | — | — |
| III | 1 | 0 | 0 | 1 | 1 | 0 | 1 | 0 | 0 | 1 | 1 | 0 | — | — | — | — |
| IV | 1 | 1 | 1 | 0 | 1 | 0 | 0 | 1 | 1 | 0 | 1 | 0 | 0 | 1 | 1 | 1 |

Figure 7:
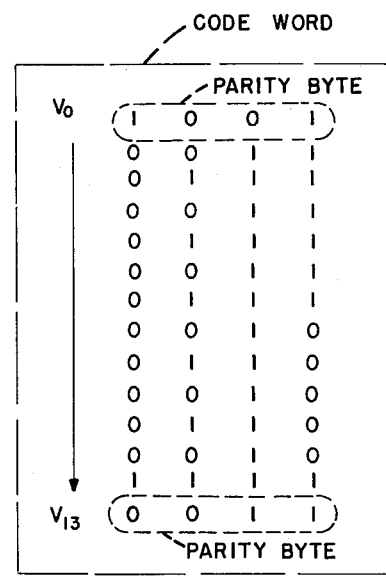
FIG. 7 is an illustration showing a code word comprised of a data block as in FIG. 6 together with generated parities shown as 4-bit bytes along lines $V_0$ and $V_{13}$.

Table IV below, shows the values computed for output parities $v_{0,j}$ by entering the values obtained in Tables II and III into equation (5) and the equations in Table I, respectively. FIG. 7 shows a code word identical to the data block of FIG. 6 except with output parities $v_{0,j}$ and $v_{13,j}$ annexed thereto. The code word is ready to exit the ECE 4.

The output parities $v_{0,j}$ and $v_{13,j}$ are annexed onto the data block when the next clock pulse occurs after the control line P/S is active. Physically, storage elements ST hold the output parities, and pass them along on parity lines $V_0$ and $V_{13}$ in synchronism with the data being passed along the data lines $V_1$ through $V_{12}$.

Table IV

| At Clock IV (using Equations from Table I) | | | | |
|---|---|---|---|---|
| $\gamma$ | $\lambda$ | $\mu$ | $\phi$ | (with appropriate subscripts) |
| $v_{13,0} =$ | $0 \oplus 0 \oplus 0 \oplus 0 = 0$ | | | |
| $v_{13,1} =$ | $1 \oplus 1 \oplus 1 \oplus 1 = 0$ | | | |
| $v_{13,2} =$ | $0 \oplus 1 \oplus 1 \oplus 1 = 1$ | | | |
| $v_{13,3} =$ | $0 \oplus 1 \oplus 0 \oplus 1 = 0$ | | | |
| At Clock IV | | | | |
| $v_{0,0} =$ | $p_1 \oplus p_4 = 1$ | | | |
| $v_{0,1} =$ | 0 | | | |
| $v_{0,2} =$ | 0 | | | |
| $v_{0,3} =$ | 1 | | | |

MATHEMATICAL BASIS FOR PARITY GENERATION IN THE (14,12) CODE

Referring to FIG. 8, the non-zero elements of a 16-element Galois Field GF(16) are expressed as powers of $\alpha$, where $\alpha$ is a root in the polynomial $X^4 + X + 1$ over the field of two. In other words, $$\alpha^4 + \alpha + 1 = 0 \text{ or} \quad (6)$$

$$\alpha^4 = \alpha + 1.$$

The powers of $\alpha$ generated from the polynomial $X^4 + X + 1 = 0$ are comprised of various combinations of $\alpha^0$, $\alpha^1$, $\alpha^2$, and $\alpha^3$ as shown in FIG. 8. The (14,12) code of the present embodiment is completely described by the statement that the code is the null space of the matrix:

$$H = \begin{pmatrix} 0 & 1 & 1 & 1 & 1 & 1 & 1 & 1 & 1 & 1 & 1 & 1 & 1 \\ 1 & \alpha^{11} & \alpha^{10} & \alpha^9 & \alpha^8 & \alpha^7 & \alpha^6 & \alpha^5 & \alpha^4 & \alpha^3 & \alpha^2 & \alpha^1 & 1 & 0 \end{pmatrix} \quad (7)$$

If $v_0$ through $v_{13}$ computed over each character is viewed as a vector $w$ or matrix whose transpose $w^t$ is $$w^t = (w_{13}, w_{12}, \ldots w_2, w_1, w_0),$$

then by definition of the code, $$Hw = 0$$

where $w_i$ represents a byte over $j$ periods comprising $$\{v_{i,0}\ v_{i,1}\ v_{i,2}\ v_{i,3}\}.$$

$Hw=0$ in component form is $$\sum_{i=0}^{12} w_i = 0 \qquad (8)$$

$$\sum_{i=1}^{12} \alpha^{i-1} w_i \oplus w_{13} = 0 \qquad (9)$$

where $\oplus$ represents addition over GF(16) and $\Sigma$ represents summation over GF(16). It should be noted that the encoded parities $w_0$ and $w_{13}$ are defined by Equations (8) and (9), respectively, as is shown in the following rearrangement (noting that in GF(16) addition and subtraction are identical).

$$w_0 = \sum_{i=1}^{12} w_i \qquad (10)$$

$$w_{13} = \sum_{i=1}^{12} \alpha^{i-1} w_i \qquad (11)$$

The terms in FIG. 8 are used to generate the modulo-2 additions detailed in Equation (3) and implemented by the hardware of the present invention. More specifically, Equation (11) becomes $$w_{13} = w_1 + \alpha w_2 + \alpha^2 w_3 + \ldots + \alpha^{10} w_{11} + \alpha^{11} w_{12} \text{ or}$$

$$w_{13} = w_1 + \alpha w_2 + \alpha^2 w_3 + \ldots + (\alpha^2 + \alpha + 1) w_{11} + (\alpha^3 + \alpha^2 + \alpha) w_{12}$$

which simplifies, as illustrated in the above example, to $$(w_4 + w_7 + w_8 + w_{10} + w_{12})\alpha^3$$
$$+ (w_3 + w_6 + w_7 + w_9 + w_{11} + w_{12})\alpha^2$$
$$+ (w_2 + w_5 + w_6 + w_8 + w_{10} + w_{11} + w_{12})\alpha$$
$$+ (w_1 + w_5 + w_8 + w_9 + w_{11})\alpha^0$$

The coefficients of $\alpha^3$, $\alpha^2$, $\alpha$, and $\alpha^0$ comprise the parity expressions for $p_3$, $p_4$, $p_5$, and $p_2$ respectively.

DECODER (ECD)

Entering the ECD 16 of FIGS. 5a and 5b are code words which may contain additive errors. The data and parity information comprising the code words are carried along information transmission lines $V_0'$ through $V_{13}'$; the primes indicating the possible presence of errors after reproduction. A frame synch pulse F/S initializes the timing of the ECD 16 so that decoding is performed on the same four characters that were encoded together. Bits $v_{0,j}'$ through $v_{13,j}'$ are checked for parity in syndrome calculator 400 as in the ECE 4, except that the $p_1$ in the ECD 16 includes $v_0'$ and is labelled $p_1^*$ and $p_2$ includes $v_{13}'$ and is labelled $p_2^*$. That is, $$p_1^* = v_0' \oplus v_1' \oplus v_2' \oplus v_4' \oplus v_5' \oplus v_8' \oplus v_{10}' \qquad (12)$$

$$p_2^* = v_1' \oplus v_5' \oplus v_8' \oplus v_9' \oplus v_{11}' \oplus v_{13}'.$$

The parity check in the syndrome calculator 400 is used to compute a syndrome S which, in the (14,12) code, comprises two four-bit elements $s_0$ and $s_1$. $s_0$ represents an error pattern in a byte and is expressed as $$s_0 = \sum_{i=0}^{12} v_{i,0}, \sum_{i=0}^{12} v_{i,1}, \sum_{i=0}^{12} v_{i,2}, \sum_{i=0}^{12} v_{i,3} \qquad (13)$$

$s_1$ is a four-bit element that determines which of the 12 data lines carries a byte in error; errors on the parity lines although detected are not corrected. $s_1$ is calculated by the ECD 16 in the same way as the $v_{13,j}$'s are calculated in the ECE 4, except with the changes previously noted in Equations (12) for $p_1^*$ and $p_2^*$.

In mathematical terms, as previously defined, $$w_{13} = \sum_{i=1}^{12} i-1^{i-1} w_i \text{ and} \qquad (11)$$

$$s_1 = \sum_{i=1}^{12} (\alpha^{i-1} w_{i,0}') \oplus v_{13,0}', \sum_{i=1}^{12} (\alpha^{i-1} w_{i,1}') \oplus v_{13,1}', \qquad (14)$$

$$\sum_{i=1}^{12} (\alpha^{i-1} w_{i,2}') \oplus v_{13,2}', \sum_{i=1}^{12} (\alpha^{i-1} w_{i,3}') \oplus v_{13,3}'$$

where $$\sum_{i=1}^{12} (\alpha^{i-1} w_{i,j}')$$

means the $j$th bit of the result of multiplying and summing the bytes generated in the parentheses, and where values for $\alpha^{i-1}$ are listed in FIG. 8. From these expressions it is evident that if there are no errors in any $w_i'$ (i.e., if $w_i' = w_i$ for all $1 \leq i \leq 12$) and the $v_{13,j}$'s are not in error (i.e., all $v_{13,j}' = v_{13,j}$), then $s_1$ becomes $w_{13} \oplus w_{13}$ calculated over the $j$ clock periods which must be 0. If there is an error on any information transmission line other than $V_0$, $s_1$ will be non-zero.

For any error pattern, $e_i$, in a single 4-tuple byte on an information transmission line $V_i$, the syndrome $S = (s_0, s_1)$ will be $$S \ni \begin{cases} (e_0, 0) & \text{if } i = 0 \\ (e_i, \alpha^{i-1} e_i) & \text{if } 1 \leq i \leq 12 \\ (0, e_{13}) & \text{if } i = 13. \end{cases}$$

When neither $s_0$ nor $s_1$ is zero, there is an error in the data. The error is represented by the syndrome $S = (s_0, s_1) = (e_i, \alpha^{i-1} e_i)$ where $e_i$ and $\alpha^{i-1} e_i$ each consist of four bits. These syndrome elements $s_0$ and $s_1$ is generated by syndrome calculator 400 (shown in FIG. 5a) which receives $v_0'$ through $v_{13}'$ information in 4-bit bytes i.e., $w_0'$ through $w_{13}'$, and produces outputs $s_0$ and $s_1$. The syndrome calculator 400 (and the parity generators 102 of ECE 4) may comprise conventional IC chips which perform parity checks like those defined in the Equations (13) and (14) for $s_0$ and $s_1$. Alternatively, it should be noted, the parity checks and syndrome elements $s_0$ and $s_1$ may be generated by means not disclosed in this preferred embodiment but which produce the same parity and syndrome computations in a different way. For example, the invention contemplates the use of more elaborate hardware which might produce output parity bytes directly (without intermediate steps) from the inputted data blocks.

$s_0$ and $s_1$ enter an OR gate 402 which detects if any bit in $s_0$ or $s_1$ is non-zero to indicate an error. The output from the OR gate 402 is stored in the storage elements 404 which store the error detection information while other circuits in the ECD 16 determine the error and correct it if possible.

As $s_0$ and $s_1$ enter OR gate 402, $s_0$ and $s_1$ are also entered as an address to ROM 406 which has words stored therein as shown in FIG. 9. $s_0$ and $s_1$ in FIG. 9 are defined in octal form. ROM 406, it should be understood, may be replaced by other computational schemes like gates. However, the ROM has been selected because of its speed and economy. There are $2^{8-1}$, or 255 possible error syndromes. ROM 406 therefore contains 255 2-digit octal words (4 binary bits) which can be addressed by the concatenated address formed by coupling the four bits of $s_0$ with those of $s_1$ as displayed in FIG. 9. Since $s_0 = e_1$ (when there is a data error) and $e_1$ represents the error pattern on a line, the unknown to be found is the value of $i$ which indicates the data line that contains the error. In other words, $s_0$ indicates an error pattern in a byte whereas $s_1$ indicates the track on which the error-containing byte is located. If the quantity stored is zero, no correction is required; if it is octal-17 (decimal-15) the syndrome represents an uncorrectable error. Otherwise, the binary value of the transfer line (octal-1 to octal-14) carrying the error is outputted.

The octal output from ROM 406 enters a binary-to-unitary decoder 408 which converts the ROM output data into decoded values $b_1$ through $b_{12}$ and $e_0$; $b_k = 1$ if the error is in line #$k$ and $e_0 = 1$ for an uncorrectable error. $b_1$ through $b_{12}$ and $e_0$ are stored in flip-flops 410. The decoded values for the $b_k$'s are conveyed as line signals that indicate which line, if any, is to be corrected. The output from flip-flops 410 is passed into OR/AND gate 412 and then into storage elements 418 of FIG. 5b after which it is gated in exclusive-OR 420 with reproduced data bits $v_1'$ through $v_{12}'$. $v_1'$ through $v_{12}'$, it should be noted, are delayed in shift register storage 422 until the corrections to be made have been determined. The output from the exclusive-OR 420 is the corrected $v_1'$ through $v_{12}'$ data which should be identical (within known limits) to the raw data entered into the ECE 4.

The output data is stored in output storage 226 and is prepared for outputting by line drivers 228.

ERASURE CORRECTION MODE (M1) OF THE (14,12) CODE

The erasure mode of the present invention is embodied in the ECD 16 which is shown in FIGS. 5a and 5b. In those figures, a number of function abbreviations are used to describe the erasure mode indicated by mode select logic 218 (shown in FIG. 3). Since the presently described embodiment examines data quality bits $d_1$ in 4-tuples measured along each data line, a function $\delta_i$ is defined as a data quality set such that:

$$\delta_1 = \begin{cases} 0 \text{ if } d_i \text{ is "0" during all four periods of the 4-tuple byte} \\ 1 \text{ otherwise} \end{cases}$$

For each data quality set, certain other functional quantities also must be computed in order to ferret out data quality errors. A function $s_0'$ is defined as:

$$s_0' = \begin{cases} s_0 \text{ if } \delta_0 = 0 \\ 0 \text{ if } \delta_0 = 1 \end{cases}$$

thereby indicating if parity byte $v_{0,j}$ ($0 \leq j \leq m$) has poor data quality. $f_0$, $f_1$, $f_2$ and $f_3$ define the number of data lines having a high probability of containing error as follows:

$$f_0 = \begin{cases} 1 \text{ if all } \delta_i\text{'s are "0"} \\ 0 \text{ if any } \delta_i \text{ is "1"} \end{cases}$$

$$f_1 = \begin{cases} 1 \text{ if exactly one } \delta_1 \text{ is "1"} \\ 0 \text{ otherwise} \end{cases}$$

$$f_2 = \begin{cases} 1 \text{ if exactly two } \delta_1\text{'s are "1"} \\ 0 \text{ otherwise} \end{cases}$$

$$f_3 = \begin{cases} 1 \text{ is more than two } \delta_1\text{'s} = 1 \\ 0 \text{ otherwise.} \end{cases}$$

Figure 10:
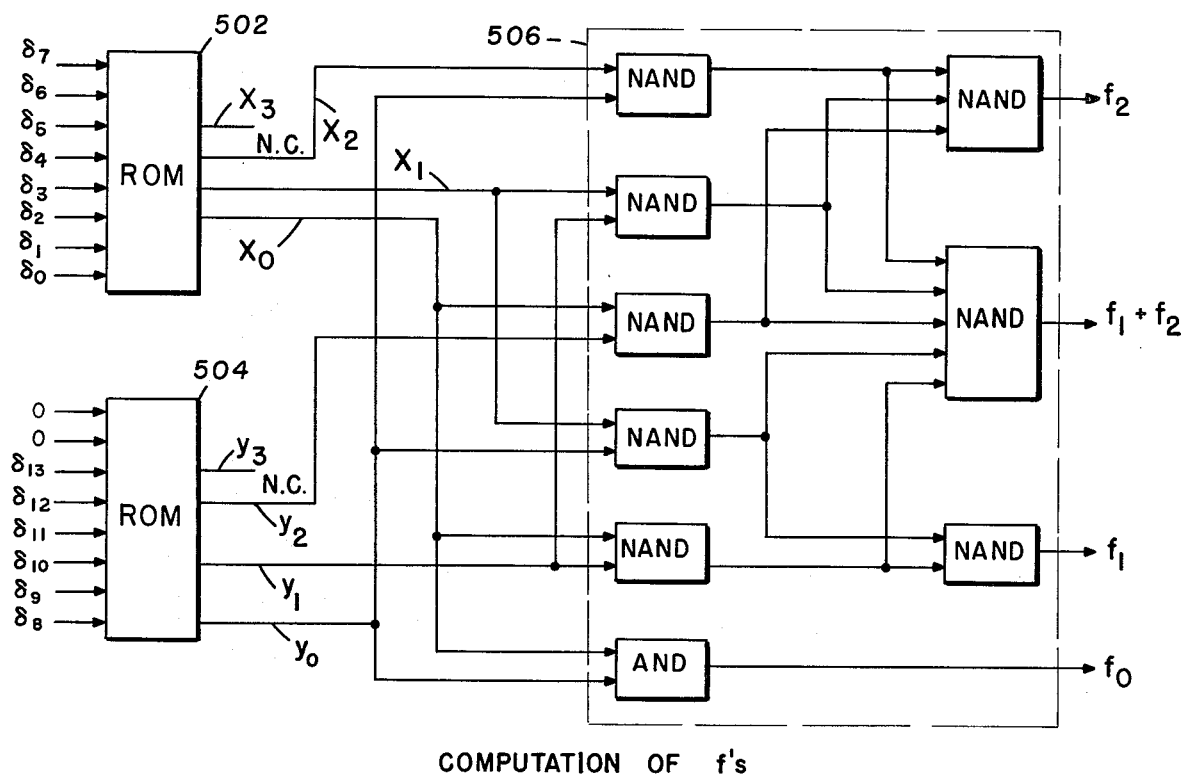
FIG. 10 is a logic circuit diagram showing the computation of the "$f$" functions used in the erasure, or data quality check, mode of the invention as exemplified with the (14,12) code.

In hardware language the "$f$" functions are determined, in the preferred embodiment, by ROMs 502 and 504 as shown in FIG. 10. The address for ROM 502 is the 8-bit binary number $\delta_7\delta_6\delta_5\delta_4\delta_3\delta_2\delta_1\delta_0$ and the address for ROM 504 is the 6-bit binary number $\delta_{13}\delta_{12}\delta_{11}\delta_{10}\delta_9\delta_8$. ROM 502 is programmed to produce an output $x_3x_2x_1x_0$; ROM 504 produces an output $y_3y_2y_1y_0$. The contents of the ROMs are determined such that $x_0 = 1$ if the address has a Hamming weight zero (i.e., none of the $\delta_1$'s in the address is "1"), $x_1 = 1$ if the address has a Hamming weight one, and $x_2 = 1$ if the address has a Hamming weight two ($x_3$ is not used). ROM 504 with its associated $y_3y_2y_1y_0$ values is similarly programmed. The outputs from ROMs 502 and 504 enter conventional logic circuitry 506 to produce the desired "$f$" functions. The "$f$" functions shown in FIG. 10 become:

$$f_0 = x_0 \cdot y_0$$
$$f_1 = x_0 \cdot y_1 + x_i \cdot y_0$$

$$f_2 = x_0 \cdot y_2 + x_1 \cdot y_1 + x_2 \cdot y_0$$

$$f_1 + f_2 = x_0 \cdot y_1 + x_i \cdot y_0 + x_0 \cdot y_2 + x_1 \cdot y_1 + x_2 \cdot y_0$$

$$f_3 = f_0 + f_1 + f_2.$$

In the (14,12) code embodiment, since the memory inputs are $\delta_i$s (which compute over four $d_i$'s), the "$f$" functions as well are computed over four successive clock periods (corresponding to the length of a code word).

Figure 11:
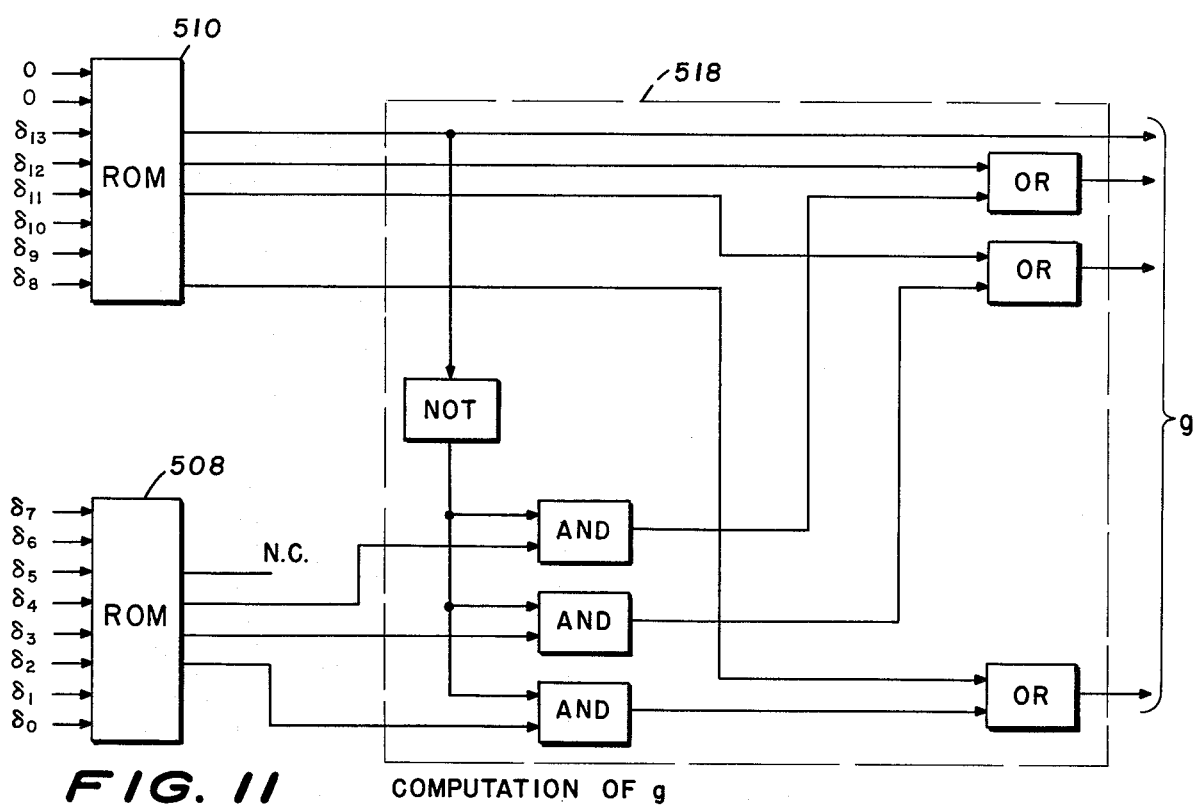
FIG. 11 is a logic circuit diagram showing the computation of the "$g$" function used in the erasure mode with the (14,12) code.
Figure 12:
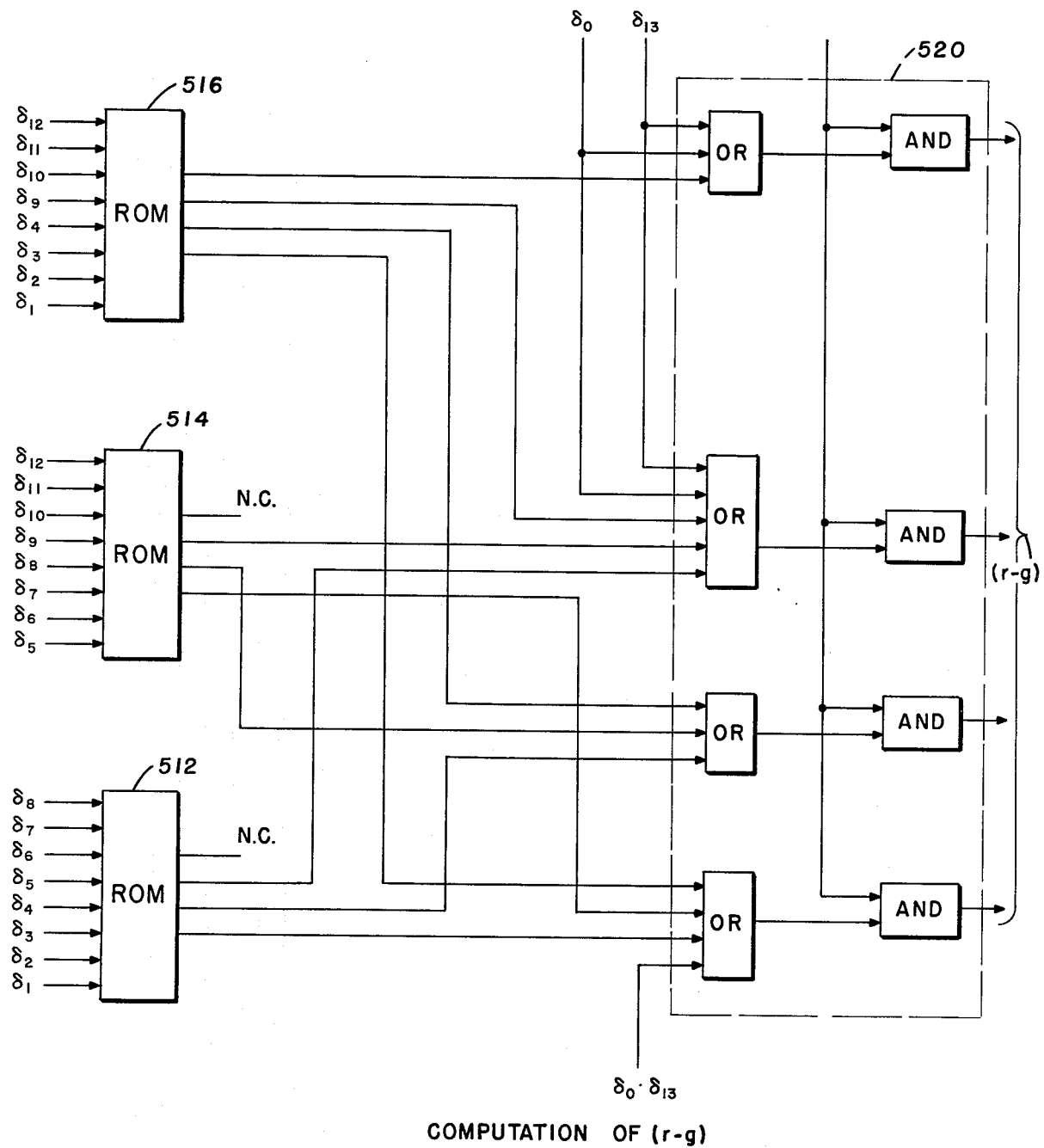
FIG. 12 is a logic circuit diagram showing the computation of the "$m$" function used in the erasure mode with the (14,12) code.

In addition to the "$f$" functions, a 4-bit binary $g$ value representing the highest line number on which there is a drop-out, i.e., a good quality indication, and a 4-bit binary $m$ value representing the separation between drop-out lines when there are exactly two drop-outs are computed. These values are computed, in the present embodiment, with ROMs 508 and 510 and 512, 514, and 516, respectively, as shown in FIGS. 11 and 12. As in the generation of the $f$ functions, the $g$ and $m$ values are computed by logically combining the ROM outputs in the corresponding logic circuitry 518 and 520.

Other functions defined and implemented by the invention in the erasure correction mode include a single drop-out test function:

| Drop-out in line #i | Test |
|---|---|
| 1 = 0 | $s_1 = 0$ |
| i = 1 to 12 | $s_0 \oplus s_1 \alpha^{1-i} = 0$ |
| i = 13 | $s_0 = 0$ |

If the single drop-out test fails and $f_1 = 1$, an uncorrectable error has occurred and an error signal $e$, in error check logic 538 (of FIG. 5a), is generated. If the test succeeds, the error is in one of the lines $1 \leq i \leq 12$ and the correction is made by adding $s_0$ to the line containing the error.

For the case in which there are two drop-out lines labelled $r$ and $g$ (i.e., $f_2 = 1$), there are four situations which may arise.

(1) There is no error, i.e., $s_0 = s_1 = 0$.
(2) One line only contains an error or errors, and that line is either line number $g$ or line number $r$.
(3) Two lines contain errors and those two are lines number $g$ and $r$.
(4) Errors occur on some line other than $g$ or $r$. (The last situation is indistinguishable from one of the first three, but is less probable and hence ignored.

If there are errors in lines $r$ and $g$ (where $13 > g > r > 0$) and $\delta_g = \delta_r = f_2 = 1$, the syndrome calculator 400 is $$(s_0, s_1) = (e_r \oplus e_g, \alpha^{r-1} e_r \oplus \alpha^{g-1} e_g).$$

This syndrome represents two equations over GF(16) in the two unknowns, $e_r$ and $e_g$ viz., $$e_r \oplus e_g = s_0 \tag{15}$$
$$\alpha^{r-1} e_r \oplus \alpha^{g-1} e_g = s_1$$

The solution to Equations (15) for $e_r$ and $e_g$ are rewritten as $$e_r = (s_0 \oplus \alpha^{1-g} s_1)(1 \oplus \alpha^{r-g})^{-1} \tag{16}$$
$$e_g = e_r \oplus s_0'$$

It should be recalled that g has been defined as the number of the high line having a data quality signal; and $(g-r)$ has been defined as the difference between the line numbers of the two lines carrying data quality signals. Further, a value $s_2$ is defined as:

$$s_2 = (s_0 \oplus \alpha^{1-g} s_1) = (s_0' \oplus s_1').$$

where $s_1'$ is determined by a ROM 522 shown in FIG. 5a and whose contents are listed in FIG. 13. As seen in FIG. 13, the contents of ROM 522 are addressed by $s_1$ and $g$ values. $s_1'$ is gated with $s_0'$ in exclusive-OR 524 to yield $s_2$ which is held in storage element 526 to be clocked out every fourth clock pulse CLK/4. $s_2$ and $m$ are fed into ROM 528 to produce $s_3$, the value of $e_r$, as shown in FIG. 14. $s_3$ is gated in exclusive-OR 530 with $s_0'$. The output from the exclusive-OR is $s_4 = s_3 \oplus s_0'$, which is the value of $e_g$. $s_3$ and $s_4$ are stored in registers 534 and 536 respectively, and are stored every CLK/4 and outputted every CLK time.

An error signal $$e = e_0 + e_1$$

is computed in error check logic 538 and stored every fourth clock pulse CLK/4. Ther error check logic 538 receives an $s_2$ input, an $e_0$ input from storage element 410, a frame pulse CLK/4 input, "$f$" function inputs, and mode inputs (M1,M2,M3) determined by mode select logic 218 (shown in FIG. 3) as follows:

M1 = (14,12) code; simple error or erasure correction

M2 = (14,12) code; simple error correction only

M3 = (14,12) code; no correction

The error check logic 538 produces outputs $e_1$ and $e_{12}$ defined respectively as $s_2 \cdot M1 \cdot (f_1 + f_3)$ and $e_0 + e_1 + M3$. $e_1$ indicates a double error in the simple error correction mode. $e_{12}$ indicates an uncorrectable detected error. The $e_1$ output serves to enable the OR/AND gate 412 shown in FIG. 5b.

Twelve selector channels $c_k$'s are computed in OR/AND gate 412 to give $$c_k = (b_k + \beta_K) \cdot e_1$$

where $$\beta_K = \begin{cases} 1 \text{ if } g = k \text{ and } f_0 = 0 \\ 0 \ (K = 1,2 \ldots, 12) \end{cases}$$

as computed in AND/OR gate 539 and where "-" indicates the complement. Each $c_k$ carries a line designator signal which is stored every fourth clock pulse CLK/4 in storage element 536 and designates the line on which a correctable error has been detected. In the erasure correction mode this will be line $g$. In the absence of data quality signals this will be line $b_k$. $c_k$ is suppressed if an error signal $e_1$ occurs. An $h_K$ is also defined for the low line data quality signal which may occur. For example, where data quality signals reflect possible errors in lines 12 and 3, $\beta_K$ for K=12 would be "1" while $h_K$ for K=3 would also be "1". The $h_K$'s may be define as:

$$h_K = \begin{cases} 1 \text{ if } g = K, f_2 = 1, \text{ and } \delta_K = 1 \\ 0 \text{ otherwise. } (K = 1,2,\ldots,12) \end{cases}$$

and computed in And/OR gate 539 as:

$$h_K = \delta_K f_2 \beta_K.$$

The $h_K$ values are stored in storage element 541.

AND/OR gate 540 ANDs $h_k$ with $s_3$ and ANDs $c_k$ with $s_4$.

The output as shown in FIg. 7b is $(h_K \cdot s_3 + c_k \cdot s_4)$ which is stored in element 542 to be gated in exclusive-OR 420 together with data bits $v_1'$ through $v_{12}'$.

From exclusive-OR 420 to final output of corrected data the erasure correction mode M1 is similar to the error correction mode M3 previously described.

ROM (READ-ONLY MEMORY) Programming rom 406 receives $s_0$ and $s_1$ as inputs. $s_0$, it should be recalled, equals $e_i$ while $s_1 = \alpha^{i-1} e_1$. Therefore, $s_1/s_0 = \alpha^{i-1}$. FIG. 8 shows the powers of $\alpha^{i-1}$, from which the value of $i$ can be readily determined. By way of example, let $s_0 = 0101$ (octal-5) and $s_1 = 0011$ (octal-3).

Depicted below is a reproduced portion of FIG. 9, the element of the memory to be calculated being specifically outlined.

| $s_1$ \ $s_0$ | 0 | 1 | 2 | 3 | 4 | 5 | 6 |
|---|---|---|---|---|---|---|---|
| 0 | | | | | | | |

-continued

| $s_1$ \ $s_0$ | 0 | 1 | 2 | 3 | 4 | 5 | 6 |
|---|---|---|---|---|---|---|---|
| 1 | | | | | | | |
| 2 | | | | | | | |
| 3 | | | | | 14 | | |

$s_1/s_0 = {}^{01011}/0101$ or $\alpha^4/\alpha^8 = \alpha^{-4} = (\alpha^{15})(\alpha^{-4}) = \alpha^{11}$ calculated from FIG. 8. With $\alpha^{i-1} = \alpha^{11}$, $i$ must be 12 (in decimal) or 14 (in octal) as seen in FIG. 9 and in the portion of that figure which is reproduced above. ROM 406, it should be noted, is programmed to give $i$ (the line containing an error) directly from the $s_0$ and $s_1$ inputs, thereby short-cutting the necessity of traversing from $s_0$ and $s_1$ to $\alpha^{i-1}$ and then to $i$.

Similarly, ROM 522 employs its inputs $s_1$ and $g$ as not only address components but also elements combinable to yield contents which represent the $s_1'$ output. $s_1'$ is defined by the programming of ROM 522 as $s_1$ multiplied by $\alpha^{1-g}$. In multiplying the factors, a power of $\alpha$ corresponding to the values of $s_1$ is determined from FIG. 8. If $s_1 = 0110 = 6$ and $g = 0111 = 7$,

| g \ $s_0$ | 0 | 1 | 2 | 3 | 4 | 5 | 6 | 7 | 10 | 11 |
|---|---|---|---|---|---|---|---|---|---|---|
| 0 | | | | | | | | | | |
| 1 | | | | | | | | | | |
| 2 | | | | | | | | | | |
| 3 | | | | | | | | | | |
| 4 | | | | | | | | | | |
| 5 | | | | | | | | | | |
| 6 | | | | | | | | | | |
| 7 | | | | | | | | | | 11 | the calculation becomes $\alpha^5$ (derived from the $\alpha$-power entry in FIG. 8 for 0110) multiplied by $\alpha^{1-7}$. $\alpha^5 \times \alpha^{-6} = \alpha^{-1}$ which when multiplied by $\alpha^{15} = 1$ (unity) gives $\alpha^{14}$, or 1001. 1001 is then converted to its corresponding octal value 11 which comprises the contents of ROM 552 at address $(s_1, g) = 0110011h1$ (binary) $= 67$ (octal). As with ROM 406, ROM522 is programmed to short-cut the processing time for obtaining $s_1'$ from $s_1$ and $g$.

Referring again to FIG. 5a, $s_1'$ is shown entering exclusive-OR 524 together with $s_0'$ to give $s_2$. $s_2$ is afterward combined in ROM 529 with the $(g-r)$ value to produce $s_3$. $s_3$, as seen in FIG. 5b, corresponds to the low line signal produced in double-error correction in the erasure mode. $s_3$ is defined logically as the following function of $s_2$ and $(g-r)$:

$$s_3 = s_2/(1 \oplus \alpha^{(r-g)}),$$

The quantity $s_3$ is defined as $s_2$ divided by $1 + \alpha^{(r-g)}$ when there are exactly two "poor" data quality signals and neither of the signals indicates a parity line (line # or line #13 in the present embodiment). If one (but not both) of the parity lines is indicated, the quantity $s_3$ is defined to be equal to $s_2$. In all other situations $s_3$ is defined to be zero (0000). These values are permanently stored at the appropriate locations in ROM 528. The exceptional cases (one parity line indicated or other than exactly two lines indicated) are handled by modifying the vlaue $(g-r)$ in the $s_3$ computation as follows: If one (but not both) parity line is indicated as having poor quality signals, the value of $(g-r)$ is set to 1100 (octal 14) regardless of which other line is also indicated. If the number of "poor" data quality signals is more than or less than two, the value $(g-r)$ is set to zero (0000).

ROMs 502 and 504 are programmed as shown in FIG. 15 to compute how many lines are turned on; ROMs 508 and 510 are programmed as in FIG. 16 to indicate the number of the highest turned-on line; ROMs 512, 514 and 516 are programmed according to FIG. 17 to indicate how far apart the turned-on lines are if only two lines are turned on.

The purpose of ROMs 502 and 504 is to determine how many lines have drop-out or poor data quality signals. The inputs as shown in FIG. 10 are the data quality signals $\delta_i$. Poor data quality is represented by a signal value of one. Considering the input as a binary number, any number with a binary representation which contains a single one (such as 00000001, 0000010, 00000100, etc.) signifies that there is exactly one poor data quality signal. In all the locations having the address 0001, 0010, 0100, etc. the quantity stored is octal 02. Any binary number with just two ones (such as 00000011, 000000101, 00000110, etc.) corresponds to exactly two poor data qualtiy signals. Every location with such a number as an address is stored in the quantity octal 04. Address 00000000, of course, corresponds to no data quality signals. Hence, at that location the quantity octal 01 is stored. Since the number of lines (14 in the embodiment described herein) exceeds the number of inputs to a single ROM, two ROMs 502 and 504 are used with the data quality lines divided between them. The network of logic gates shown in FIG. 10 determines the total number of poor data quality signals and generates the functions $f_o$, $f_1$, $f_2$, only one of which may have the value one, and $(f_1 \text{ OR } f_2)$. If more than two poor data quality signals occur then all these functions will be zero. A subsequent circuit (not shown) determines this fact and generates a function $f_3$ which has the value one if and only if $f_0 = f_1 = f_2 = 0$.

Various other modifications, adaptations and alterations are of course possible in light of the above teachings. It should therefore be understood that within the scope of the appended claims the invention may be practiced otherwise than as was specifically described.

We claim:

1. A method for correcting errors introduced during the recording of data bits onto and reproduction of data bits from a plurality of parallel data tracks on a magnetic storage medium, comprising the steps of:
   encoding data prior to recording, which comprises the steps of:
      entering characters of data, comprising a data bit from each track, into an encoder,
      formatting the entered data into a data block, said data block being defined as k $m$-bit bytes wherein the data block comprises a byte along each of k data tracks, where "$m$" and "$k$" are integers,
      generating at least one $m$-bit output parity byte corresponding to each data block comprising the steps of:
         generating initial parity bits by selectively combining the data bits as each character is entered into the encoder,
         combining the generated initial parity bits for every data block, in predetermined fashion, in order to produce intermediate parity bits, and
         combining and reading the intermediate parity bits to produce $m$-bit output parity bytes onto separate parity tracks which are synchronous with the data tracks, and a
   decoding the data following reproduction.

2. A method, as in claim 1, wheren the decoding comprises the steps of:
   feeding the data block and parity byte bits as they are after reproduction into a decoder,
   calculating a syndrome from the fed-in data block and parity byte bits,
   matching each calculated syndrome to a particular error pattern word stored in a memory means, and
   entering the error pattern word into error correction circuitry.

3. A method, as in claim 2, wherein the calculating of the syndrome comprises the steps of:
   combining data-prime bits, which represent the data bits after reproduction, in a manner similar to the combining of data bits in the generating of initial parity bits during encoding except that the initial parity bits after reproduction are included in the combining, thereby generating initial parity-prime bits,
   combining the initial parity-prime bits, in a manner identical to the combining of initial parity bits during encoding, to produce intermediate parity-prime bits,
   combining the intermediate parity-prime bits, in a manner identical to the combining of intermediate parity bits during encoding, to produce parity-prime bytes,
   comparing the output parity bytes as they are after reproduction with corresponding parity-prime bytes derived from data bits combined after reproduction to detect discrepancies between the output parity bytes and the parity-prime bytes, and
   producing a syndrome output corresponding to each discrepancy detected.

4. A method, as in claim 2, wherein the entering of the characters during the encoding and the feeding of the data block and parity bytes during the decoding of the data are continuous.

5. A method of encoding raw data and decoding reproduced data formatted in an $(n,k)$ format, "$n$" representing the combined number of data plus parity lines and "k" representing the number of data lines, comprising the steps of:
   encoding the data which comprises the step of:
      associating bits along each of the $k$ data lines into $m$-bit bytes,
      synchronizing the bytes on all $k$ data lines.
      selectively combining bits selected from the $m$-bit bytes on each of the $k$ data lines to produce $(n-k)$ $m$-bit output parity bytes, and
   decoding the data which comprises the steps of:
      combining the values of selected data-prime bits, which represent the associated data bits after reproduction, in a manner similar to the selective combining during encoding, thereby producing parity-prime bytes,
      comparing the output parity bytes as they are after reproduction with the parity-prime bytes, produced from the data-prime bits, and producing a syndrome referred to as $\{s_0 s_1\}$ based on the comparison,
      feeding the synchrome $\{s_0 s_1\}$ to a memory, and
      associating the produced syndrome with either a no-error signal or a corresponding error pattern and error line signal in the memory.

6. A method of encoding and decoding data formatted in an $(n,k)$ format, "$n$" representing the combined number of data plus parity lines and "$k$" representing the number of data lines, as in claim 5, comprising the further step of:
   time controlling the data such that the prime bits associated during decoding are associated into data blocks in the same manner as are the data bits during encoding.

7. A method of encoding and decoding data formatted in an $(n,k)$ format, "$n$" representing the combined number of data plus parity lines and "$k$" representing the number of data lines, as in claim 6, comprising the further step of programming the memory which comprises the steps of:
   generating a first syndrome word $s_0$ which represents a burst error pattern $e_i$ in an $m$-bit byte on track $i$ and generating a second syndrome word $_1$ such that it equals $\alpha^{i-1} e_i$ where $\alpha$ is a non-zero root of a primitive polynomial,
   converging the $s_i$ and $s_0$ values into corresponding powers of $\alpha$,
   dividing the power of $\alpha$ corresponding to $s_1$ by the power of $\alpha$ corresponding to $s_0$ to yield a quotient having a power of $\alpha$ equal to $(-1)$.

8. A method of encoding and decoding data formatted in an $(n,k)$ format, "$n$" representing the combined number of data plus parity lines and "$k$" representing the number of data lines, as in claim 7, wherein the programming of the memory comprises the further step of:
   assigning an output equal to the error-line number $i$, corresponding to appropriate $s_0$ and $s_1$ syndrome words, for each correctable error.

9. A method of encoding and decoding data formatted in an $(n,k)$ format, "$n$" representing the combined number of data plus parity lines and "$k$" representing the number of data lines, as in claim 8, comprising the further step of:
   inhibiting the error-line number memory output when errors are detected in more than one data line and when other detactable but uncorrectable errors are identified.

10. Apparatus for identifying burst-type errors occurring in a data channel having $k$ parallel input data lines, comprising:
   means for clocking in characters of data bits, which comprise a bit from each input data line where all such bits are synchronous, the characters being clocked into the apparatus as inputs on each clock pulse,
   means, connected to the input data lines, for generating initial parity bits derived from the input data bits as each character is clocked in,
   means, connected to the initial parity bit generating means, for storing the initial parity bits and selectively combining the generated initial parity bits over $m$ clock pulse periods to produce intermediate parity bits,
   means, connected to the intermediate parity bit generating means, for combining selected intermediate parity bits, before any possible data corruption is introduced, to produce $m$-bit output, parity bytes, after $m$ clock pulse periods,
   means for generating and combining selected data-prime bits occurring during a period of $m$ clock pulses, after possible data corruption, to produce $m$-bit parity-prime bytes, wherein the generating of parity-prime bytes is accomplished in a manner similar to output parity byte generation, means, receiving the output parity bytes and parity-prime bytes as inputs, for comparing each output parity byte with its corresponding parity-prime byte and indicating discrepancies as a syndrome, and means for reading the syndrome and indicating errors corresponding to the syndrome.

11. Apparatus for identifying burst-type errors occurring in a data channel having $k$ parallel input data lines, as in claim 10, further comprising:

means for correcting selected, detected burst-type errors which comprises:
  memory means, connected to the means for reading the syndrome and indicating errors, for determining which data lines carry errors,
  line designator means, connected to the memory means, for producing error correction signals on data lines identified as carrying errors, and
  error check logic means, connected to the line designator means, for determining when detected errors are correctable and when correction signals produced by the line designator means are to be inhibited.

12. Apparatus for identifying burst-type errors occurring in a data channel having $k$ parallel input data lines, as in claim 10, wherein the bits to be combined in the means for storing and selectively combining bits are selected in accordance with a non-binary code.

13. Apparatus for identifying burst-type errors occurring in a data channel having $k$ parallel input data lines, as in claim 12, wherein the non-binary code is cyclic and is generated from the primitive polynomial $X^4 + X + 1$.

14. Apparatus for identifying burst-type errors occurring in a data channel having $k$ parallel input data lines, as in claim 13, wherein the code is selected from the set of codes defined as the null space of a parity-check matrix $$H = \begin{pmatrix} 1 & 1 & 1 & 1 & 1 & 1 & 1 & 1 & 1 & 1 & 1 & 1 \\ 1 & \alpha^{11} & \alpha^{10} & \alpha^9 & \alpha^8 & \alpha^7 & \alpha^6 & \alpha^5 & \alpha^4 & \alpha^3 & \alpha^2 & \alpha^1 & \alpha^0 & 0 \end{pmatrix}$$

where $\alpha$ represents a non-zero root of the primitive polynomial $X^4 + X + 1$ and all substantially equivalent codes.

15. Apparatus for identifying burst-type errors occurring in a data channel having $k$ parallel input data lines, as in claim 13 wherein the code is selected from the set of codes defined as the null space of a parity-check matrix $$H = \begin{pmatrix} 1 & 0 & 0 & 1 & 1 & 1 & 0 & 0 & 1 & 0 & 0 & 0 & 0 & 0 \\ 0 & 1 & 0 & 1 & 0 & 0 & 1 & 0 & 1 & 1 & 0 & 0 & 0 & 0 \\ 0 & 0 & 1 & 1 & 0 & 1 & 0 & 1 & 1 & 1 & 1 & 0 & 0 & 0 \\ 0 & 0 & 0 & 0 & 0 & 1 & 1 & 0 & 0 & 1 & 1 & 1 & 0 & 0 \\ 0 & 0 & 0 & 1 & 1 & 0 & 0 & 1 & 1 & 1 & 0 & 0 & 1 & 0 \\ 0 & 0 & 0 & 0 & 1 & 1 & 0 & 0 & 1 & 1 & 1 & 0 & 0 & 1 \end{pmatrix}$$

and all substantially equivalent codes.

16. In an encoder/decoder device for correcting burst errors of any length along data-carrying data lines, employing an $(n,k)$ generalized code, where "$n$" represents the number of data lines, "$k$", plus parity lines, an encoder comprising:

means for formatting data into data blocks having the dimensions of $m$ bits defined as a byte along each data line by $k$ bits defined as a character across the $k$ data lines, means, connected to receive the data blocks from the data formatting means, for generating a set of $m$-bit output parity bytes in accordance with a predetermined parity check matrix, such that each set of parity bytes is generated from data in a corresponding data block, and means for transferring the parity bytes from the output parity byte generating means, onto the $(n,k)$ parity lines synchronous with the $m$-bit data bytes carried on the $k$ data lines, and a decoder, which reads the data and parity information after reproduction, comprising:

syndrome calculator means for generating parity-prime bytes by combining data-prime bits, defined as data bits formatted after reproduction in a data block of $m$ characters corresponding to the data block formatted during encoding, in a manner similar to the generating of the output parity bytes by the encoder; for comparing the output parity bytes from the encoder with the parity-prime bytes from the decoder; and for, thereafter, producing syndrome words $s_0$ and $s_1$ which are related to the discrepancies, if any, between the output parity bytes and parity-prime bytes.

17. In an encoder/decoder device for correcting burst errors of any length along data-carrying data lines, employing an $(n,k)$ generalized code, where "$n$" represents the number of data lines, "$k$", plus parity lines as in claim 16, wherein $n = 14$ and $k = 8$ and wherein any errors on three adjacent lines, two adjacent lines, one single line, and on two lines separated by one error-free line are corrected.

18. An error-correcting encoder/decoder device, as in claim 16, further comprising:
  input lines to the decoder which carry data quality signals,
  erasure correction computation means for comparing the error indications generated by parity checks with error indications generated by data quality signals.

19. An error-correcting encoder/decoder device, as in claim 16, wherein the decoder further comprises:
  means included within the syndrome calculator means for identifying an error pattern in an $m$-bit byte in an unknown data line and representing the error pattern by one of the syndrome words, and
  memory means, having the calculated syndrome words as inputs, for determining which data lines carry errors.

20. An error-correcting encoder/decoder device, as in claim 19, further comprising:
  data quality indicators, each of which indicates possible errors on a data line, and
  means for comparing the data quality indicator outputs with the memory means data line error output.

21. An error-correcting encoder/decoder device, as in claim 16, wherein the means for generating output parity bytes comprises:
  a first stage of logic adders each of which adds the same selected bits of each entered character thereby producing initial parity bits for each character,
  a second stage of logic adders for adding selected initial parity bits taken from the $m$ characters of a data block thereby producing intermediate parity bits, and
  a third stage of logic adders for adding selected intermediate parity bits generated over $m$ characters thereby generating (n-k) output parity bytes m bits in length, where the initial parity bits selected to produce the intermediate parity bits and the intermediate parity bits selected to produce output parity bytes are determined by the parity-check matrix.

22. An encoder/decoder device for correcting errors of any length along data-carrying lines, employing an (n,k) generalized code, as in claim 21,
where the (n,k) code is a (14,12) code and
where the first stage of adders comprise means for generating five initial parity bits defined as:

$$p_1 = v_1 \oplus v_2 \oplus v_4 \oplus v_5 \oplus v_8 \oplus v_{10}$$

$$p_2 = v_1 \oplus v_5 \oplus v_8 \oplus v_9 \oplus v_{11}$$

$$p_3 = v_4 \oplus v_7 \oplus v_8 \oplus v_{10} \oplus v_{12}$$

$$p_4 = v_3 \oplus v_6 \oplus v_7 \oplus v_9 \oplus v_{11} \oplus v_{12}$$

$$p_5 = v_2 \oplus v_5 \oplus v_6 \oplus v_8 \oplus v_{10} \oplus v_{11} \oplus v_{12},$$

$v_i(1 \leq i \leq 12)$ representing a data bit on the ith data line,
where the second stage of adders comprise means for combining the initial parity bits over $m=4$ characters to yield intermediate parity bits symbolized as $\phi_j, \mu_j, \lambda_j,$ and $\delta_j,$
where $(\phi_0, \mu_0, \lambda_0, \delta_0) = (p_2, p_3, p_4, p_5)$
and where $\phi_j = \phi_{j-1}, \mu_j = \mu_{j-1}, \lambda_j = \lambda_{j-1},$ and $\delta_j = \delta_{j-1}$ except that $\delta_1 = \delta_0 \oplus \lambda_0, \lambda_2 = \lambda_1 \oplus \mu_1,$ and $\mu_3 = \mu_2 \oplus \phi_2$ where one output parity byte is comprised of the bits: $\{v_{13,0}, v_{13,1}, v_{13,2}, v_{13,3}\}$ such that $v_{13,j} = \delta_j \oplus \lambda_{j+1} \oplus \mu_{j+2} \oplus \phi_{j+3}$ (where $0 \leq j \leq 3$ and where the subscripts are in modulo-4 with carries suppressed) and where another output parity byte is comprised of the bits: $\{v_{0,1} v_{0,2} v_{0,4}\}$ such that $v_{0,j} = p_1 \oplus p_4$ for each jth character.

23. An error-correcting encoder/decoder device, as in claim 18, wherein the erasure correction computation means relates to two-line burst error correction and further comprises:
first function generator means for producing outputs labelled as $\delta_i$'s, $\delta_i = 1$ if any bits in a byte on the ith data line of a code word being decoded has poor data quality with $\delta_i = 0$ otherwise,
second function generator means, receiving the $\delta_i$ outputs from the first function generator means as inputs, for indicating how many data lines over a single code word carry data of poor quality,
third function genrator means receiving the $\delta_i$ outputs from the first function generator means as inputs, for determining the highest and lowest numerical data lines referred to as g and r, respectively) which carry data of poor quality only if two data lines carry data of poor quality are indicated by the second function generator means, and
error check logic means for logically combining outputs from the first and second function generators with outputs derived from the syndrome calculator to detect and correct errors occurring on two data lines.

24. An error-correcting encoder/decoder device, as in claim 23,
wherein the syndrome calculator produces syndrome words represented by: $s_0$ which corresponds to the error pattern $e_i$ in a data type; $s_1 \alpha^{i-1} e_i$ where $\alpha$ corresponds to a root of a chosen primitive polynomial; and $s_0'$ defined as $s_0$ if $\delta_0 = 0$ and as 0 if $\delta_0 = 1$, where $i = 0$ represents a parity line, and wherein the erasure correction computation means further comprises:
first memory means, connected to the syndrome calculator, having $s_0$ and $s_1$ as inputs and the error-carrying line number as an output,
second memory means, connected to the syndrome calculator, having $s_1$ and g as inputs and $s_1' = s_1(\alpha^{1-g})$ as an output,
exclusive-OR means for combining $s_0'$ with $s_1'$ to produce $s_2$ as an output,
third memory means for receiving $s_2$ and $(g-r)$ as inputs and $s_3 = s_2/(1+\alpha^{r-g})$ as an output indicating the low line carrying data of poor quality,
exclusive-OR means for combining $s_3$ with $s_0'$ to produce $s_4$ as an output indicating the high line carrying data of poor quality, and
logic means for producing the $s_3$ and $s_4$ outputs only for appropriate poor quality data lines where only two data lines have poor data quality.

25. In an encoder/decoder device for correcting burst errors of any length along data-carrying data lines, employing an (n,k) generalized code, where "n" represents the number of data lines, "k", plus parity lines as in claim 16, wherein the generalized code is a (14,12) code and wherein the parity byte generating means comprises:
a first exclusive-OR gating network which produces initial parity bits $p_1, p_2, p_3, p_4,$ and $p_5$ by selectively combining the twelve incoming data bits $v_1$ through $v_{12}$,
a second exclusive-OR gating network, connected to the first exclusive-OR gating network, for storing and selectively combining the initial parity bits generated during m clock periods to produce intermediate parity bits, and
means for combining the intermediate parity bits to produce output parity bytes each comprised of m bits.

26. In an encoder/decoder device for correcting burst errors of any length along data-carrying data lines, employing an (n,k) generalized code, where "n" represents the number of data lines, "k", plus parity lines as in claim 25, wherein any error on a single line is corrected.

27. In an encoder/decoder device for correcting burst errors of any length along data-carrying data lines, employing an (n,k) generalized code, where "n" represents the number of data lines, "k", plus parity lines as in claim 25, wherein the initial parity bits produced by the first exclusive-OR gate are defined as:

$$p_1 = v_1 \oplus v_2 \oplus v_4 \oplus v_5 \oplus v_8 \oplus v_{10}$$

$$p_2 = v_1 \oplus v_5 \oplus v_8 \oplus v_9 \oplus v_{11}$$

$$p_3 = v_4 \oplus v_7 \oplus v_8 \oplus v_{10} \oplus v_{12}$$

$$p_4 = v_3 \oplus v_6 \oplus v_7 \oplus v_9 \oplus v_{11} \oplus v_{12}$$

$$p_5 = v_2 \oplus v_5 \oplus v_6 \oplus v_8 \oplus v_{10} \oplus v_{11} \oplus v_{12}.$$

28. In an encoder/decoder device for correcting burst errors of any length along data-carrying data lines, employing an (n,k) generalized code, where "n" represents the number of data lines, "k", plus parity lines as in claim 27, wherein the second exclusive-OR gating network produces subscripted — $\delta$, $\lambda$, $\mu$, and $\phi$ outputs defined as:

$$\delta_0 = p_2; \lambda_0 = p_3; \mu_0 = p_4; \phi_0 = p_5$$

$$\delta_1 = \delta_0 \oplus \lambda_0; \lambda_1 = \lambda_0; \mu_1 = \mu_0; \phi_1 = \phi_0$$

$$\delta_2 = \delta_1; \lambda_2 = \lambda_1 \oplus \mu_1; \mu_2 = \mu_1; \phi_2 = \phi_1$$

$$\delta_3 = \delta_2; \lambda_3 = \lambda_2; \mu_3 = \mu_2 \oplus \phi_2; \phi_3 = \phi_2,$$

where subscripts represent successive ORing steps.

29. In an encoder/decoder device for correcting burst errors of any length along data-carrying data lines, employing an $(n,k)$ generalized code, where "$n$" represents the number of data lines, "$k$", plus parity lines as in claim 28, wherein one output parity byte is defined as $v_{i,j}$, $i$ representing the parity line number and $j$ the ORing step, and wherein $$v_{i,0} = \delta_0 \oplus \lambda_1 \oplus \mu_2 \oplus 100_3$$

$$v_{i,1} = \delta_1 \oplus \lambda_2 \oplus \mu_3 \oplus \phi_0$$

$$v_{i,2} = \delta_2 \oplus \lambda_3 \oplus \mu_0 \oplus \phi_1$$

$$v_{i,3} = \delta_3 \oplus \lambda_0 \oplus \mu_1 \oplus \phi_2.$$

30. In an encoder/decoder device for correcting burst errors of any length along data-carrying data lines, employing an $(n,k)$ generalized code, where "$n$" represents the number of data lines, "$k$", plus parity lines as in claim 29, wherein a second output parity byte $v_{i,j}$ is defined as:

$$v_{i,0} = p_1 \oplus p_4$$

where the value of $v_{i,0}$ changes on each clock pulse as $p_1$ and $p_4$ change while the value of $v_{i,0}$ is shifted to $v_{i,1}$ then to $v_{i,2}$ and finally to $v_{i,3}$ on successive clock pulses.

31. In an encoder/decoder device for correcting burst errors of any length along data-carrying data lines, employing an $(n,k)$ generalized code, where "$n$" represents the number of data lines, "$k$", plus parity lines as in claim 30, further comprising a docoder which comprises:

means for inputting data-prime bits $v_1'$ through $v_{12}'$ and parity-prime bits $v_0'$ and $v_{13}'$, the parity-prime bits which over $m$ clocks comprise parity-prime bytes, into the decoder, and two exclusive-OR gating networks and combining means identical to those in the encoder except that $p_1$ and $p_2$ are redefined as $p_1^*$ and $p_2^*$ to include parity-prime bits $v_0'$ and $v_{13}'$, i.e., $v_0$ and $v_{13}$ after reproduction, generated by the encoder and inputted by the decoder input means:

$$p_1^* = v_0' \oplus v_1' \oplus v_2' \oplus v_4' \oplus v_5' \oplus v_8' \oplus v_{10}'$$

$$p_2^* = v_1' \oplus v_5' \oplus v_8' \oplus v_9' \oplus v_{11}' \oplus v_{13}'.$$

32. In an encoder/decoder device for correcting burst errors of any length along data-carrying data lines, employing an $(n,k)$ generalized code, where "$n$" represents the number of data lines, "$k$", plus parity lines as in claim 31, further comprising:

a syndrome generator which produces two four-bit outputs $s_0$ and $s_1$ defined as:

$$s_0 = \sum_{i=0}^{12} v'_{i,0}, \sum_{i=0}^{12} v'_{i,1}, \sum_{i=0}^{12} v'_{i,2}, \sum_{i=0}^{12} v'_{i,3}$$

$$s_1 = \sum_{i=1}^{12} (\alpha^{i-1} w'_{i,0}) \oplus v'_{13,0}, \sum_{i=1}^{12} (\alpha^{i-1} w'_{i,1}) \oplus v'_{13,1}$$

$$\sum_{i=1}^{12} (\alpha^{i-1} w'_{i,2}) \oplus v'_{13,2}, \sum_{i=1}^{12} (\alpha^{i-1} w'_{i,3}) \oplus v'_{13,3}$$

where $$\sum_{i=1}^{12} (\alpha^{i-1} w'_{i,j})$$

means the jth bit of the result of multiplying and summing the bytes generated in the parentheses, and where $\alpha$ is a root of a primitive polynomial.

33. In an encoder/decoder device for correcting burst errors of any length along data-carrying data lines, employing an $(n,k)$ generalized code, where "$n$" represents the number of data lines, "$k$", plus parity lines as in claim 32, further comprising:

means for determining an error pattern from the generated syndrome outputs $s_0$ and $s_1$.

* * * * *

UNITED STATES PATENT OFFICE
CERTIFICATE OF CORRECTION

Patent No. 4,107,650              Dated     8/15/78

Inventor(s)  Perry J. Luke, James L. Machamer, William A. Becraft

It is certified that error appears in the above-identified patent and that said Letters Patent are hereby corrected as shown below:

Column 22, line 22, change "(-1)" to --(i-1)--

Column 22, line 39, change "detactable" to --detectable--

Column 27, line 20, change "$100_3$" to --$\phi_3$--.

Signed and Sealed this

Seventh Day of August 1979

[SEAL]

Attest:

Attesting Officer

LUTRELLE F. PARKER
Acting Commissioner of Patents and Trademarks